United States Patent
Chang et al.

(10) Patent No.: US 8,367,498 B2
(45) Date of Patent: Feb. 5, 2013

(54) FIN-LIKE FIELD EFFECT TRANSISTOR (FINFET) DEVICE AND METHOD OF MANUFACTURING SAME

(75) Inventors: Chih-Hao Chang, Chu-Bei (TW); Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/906,820

(22) Filed: Oct. 18, 2010

(65) Prior Publication Data

US 2012/0091528 A1 Apr. 19, 2012

(51) Int. Cl.
*H01L 27/12* (2006.01)
*H01L 21/336* (2006.01)

(52) U.S. Cl. ........... 438/268; 438/279; 257/E21.409; 257/E27.112

(58) Field of Classification Search ........... 438/279, 438/268
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0181477 A1 | 7/2009 | King et al. | |
| 2010/0006945 A1 | 1/2010 | Merelle et al. | |
| 2010/0006974 A1 | 1/2010 | Xu et al. | |
| 2010/0052059 A1 | 3/2010 | Lee | |
| 2010/0183961 A1 | 7/2010 | Shieh et al. | |
| 2010/0203734 A1 | 8/2010 | Shieh et al. | |
| 2010/0264468 A1 | 10/2010 | Xu | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Alexander Ghyka
(74) *Attorney, Agent, or Firm* — Haynes and Boone, LLP

(57) ABSTRACT

A FinFET device and method for fabricating a FinFET device is disclosed. An exemplary method includes providing a semiconductor substrate; forming a fin structure over the semiconductor substrate, the fin structure including a first material portion over the semiconductor substrate and a second material portion over the first material portion; forming a gate structure over a portion of the fin structure, such that the gate structure traverses the fin structure, thereby separating a source region and a drain region of the fin structure, wherein the source and drain regions of the fin structure define a channel therebetween; removing the second material portion from the source and drain regions of the fin structure; and after removing the second material portion, forming a third material portion in the source and drain regions of the fin structure.

19 Claims, 24 Drawing Sheets

U.S. PATENT DOCUMENTS

2012/0104472 A1   5/2012   Xu et al.

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

Unpublished U.S. Appl. No. 12/702,862 filed Feb. 9, 2010, entitled, "Bottom-Notched SiGe FinFET Formation Using Condensation".

FIN-LIKE FIELD EFFECT TRANSISTOR (FINFET) DEVICE AND METHOD OF MANUFACTURING SAME

CROSS-REFERENCE TO RELATED APPLICATIONS

The present disclosure is related to commonly-assigned U.S. patent application entitled Fin-Like Field Effect Transistor (FinFET) Device and Method of Manufacturing Same Ser. No. 12/917,902, filed Nov. 2, 2010, the entire disclosure of which is incorporated herein by reference.

BACKGROUND

As the semiconductor industry has progressed into nanometer technology process nodes in pursuit of higher device density, higher performance, and lower costs, challenges from both fabrication and design have resulted in the development of three dimensional designs, such as fin-like field effect transistors (FinFETs). A typical FinFET is fabricated with a thin "fin" (or fin structure) extending from a substrate, for example, etched into a silicon layer of the substrate. The channel of the FinFET is formed in the vertical fin. A gate is provided over (e.g., wrapping) the fin. It is beneficial to have a gate on both sides of the channel allowing gate control of the channel from both sides. FinFET devices also include strained source/drain features to enhance carrier mobility and improve device performance. The strained source/drain features typically use epitaxial (epi) silicon germanium (SiGe) in p-type devices and epi silicon (Si) in n-type devices. FinFET devices provide numerous advantages, including reduced short channel effects and increased current flow. Although existing FinFET devices and methods for fabricating FinFET devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
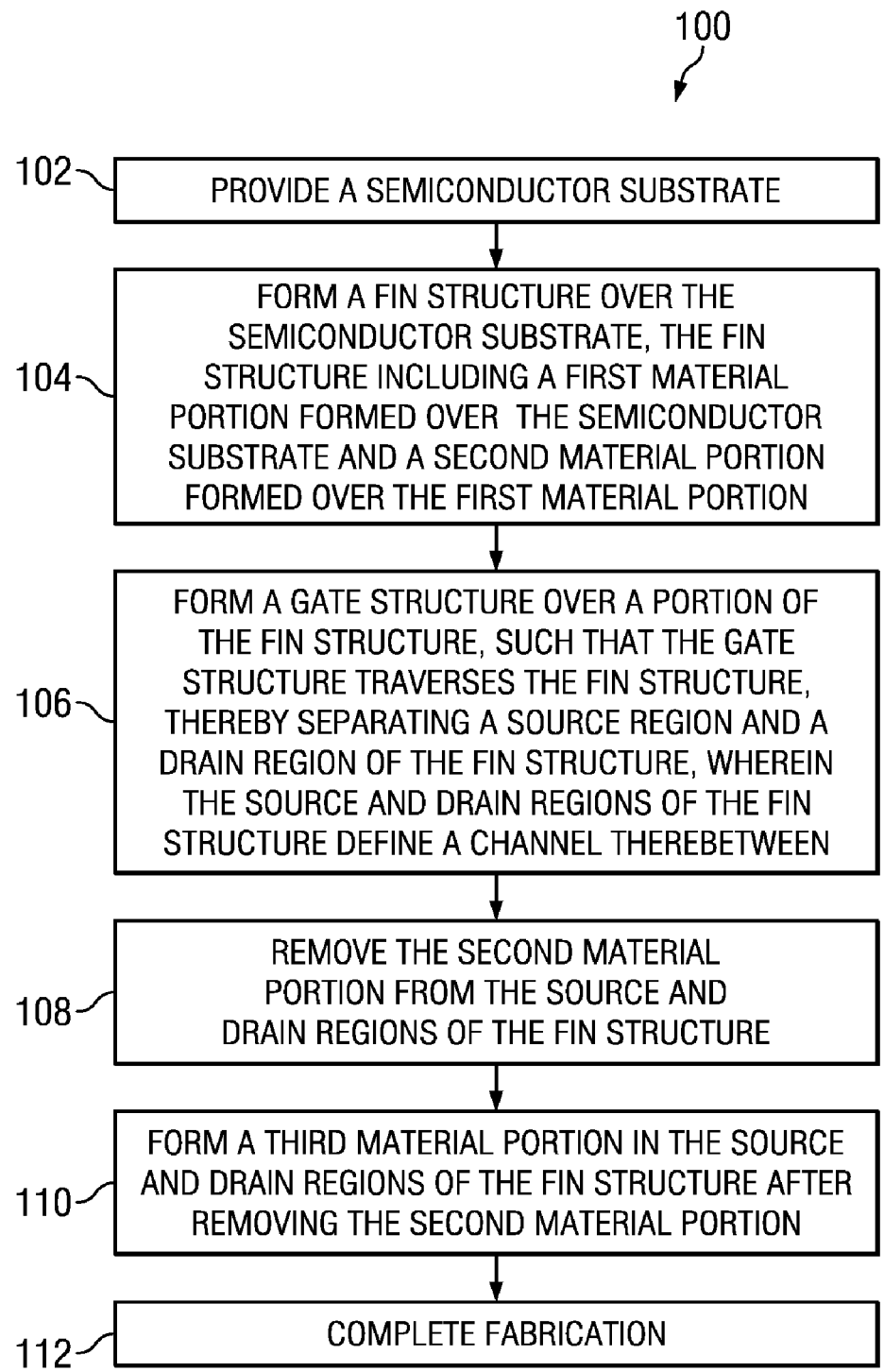
FIG. 1 is a flow chart of a method for fabricating a fin-like field effect transistor (FinFET) device according to aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 100 for fabricating an integrated circuit device according to various aspects of the present disclosure. In the depicted embodiment, the method 100 fabricates an integrated circuit device that includes a fin-like field effect transistor (FinFET) device. The method 100 begins at block 102 where a semiconductor substrate is provided. At block 104, a fin structure is formed over the semiconductor substrate. More specifically, a first material portion of the fin structure is formed over the semiconductor substrate, and a second material portion of the fin structure is formed over the first material portion. At block 106, a gate structure is formed over a portion of the fin structure. The gate structure traverses the fin structure, separating a source region and a drain region of the fin structure. A channel is defined between the source and drain regions. At blocks 108 and 110, the second material portion is removed from the source and drain regions of the fin structure, and a third material portion is formed in the source and drain regions of the fin structure. The method 100 continues with block 112 where fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2A-2C, 3A-3C, and 4A-4C provide various views of a FinFET device 200, in portion or entirety, at various stages of fabrication according to the method 100 of FIG. 1. FinFET device refers to any fin-based transistor, such as a fin-based, multi-gate transistor. The FinFET device 200 may be included in a microprocessor, memory cell, and/or other integrated circuit device. In the depicted embodiment, the FinFET device 200 is a p-type metal-oxide-semiconductor (PMOS) FinFET device. FIGS. 2A-2C, 3A-3C, and 4A-4C have been simplified for the sake of clarity to better understand the inventive concepts of the present disclosure. Additional features can be added in the FinFET device 200, and some of the features described below can be replaced or eliminated in other embodiments of the FinFET device 200.

Figure 2A:
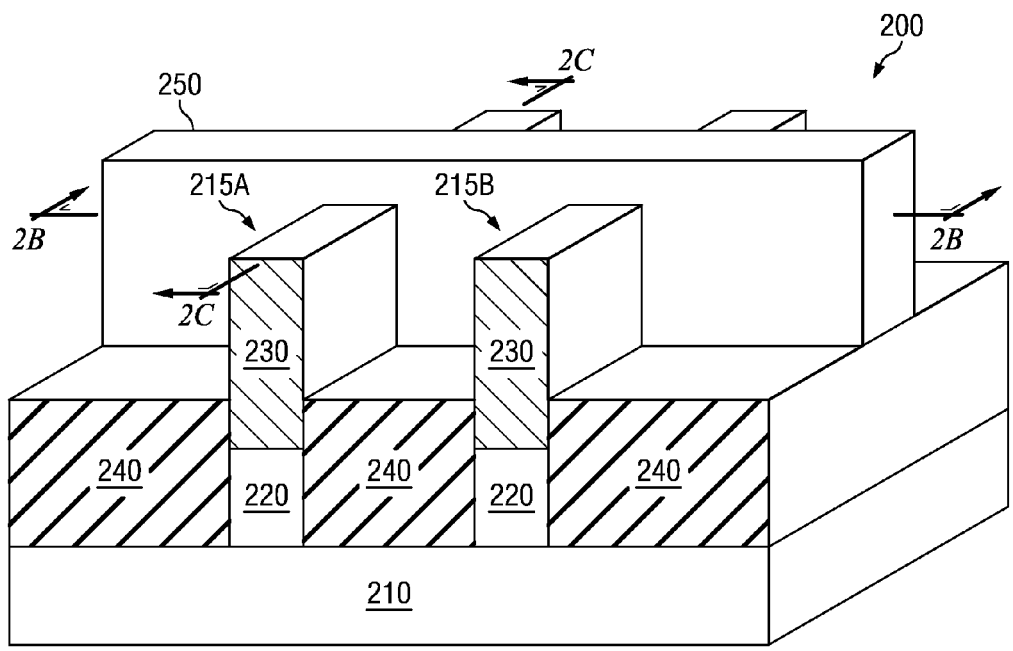
FIGS. 2A, 3A, and 4A are perspective views of a FinFET device at various fabrication stages according to the method of FIG. 1.
Figure 2B:
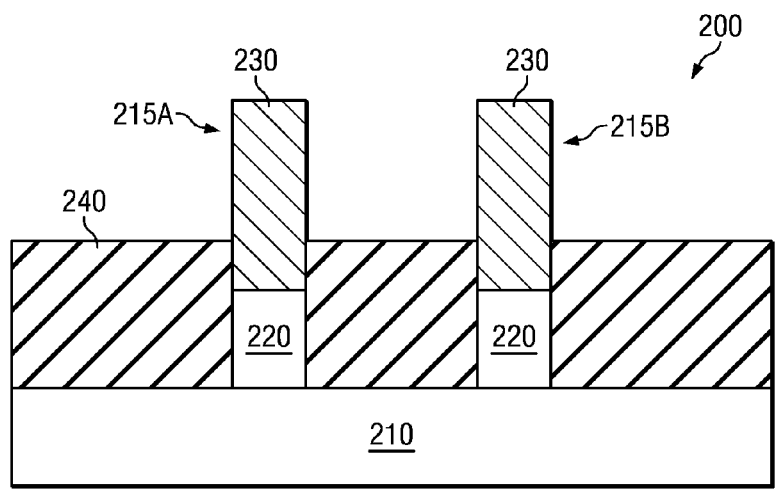
FIGS. 2B, 3B, and 4B are diagrammatic cross-sectional views of the FinFET device of FIGS. 2A, 3A, and 4A, respectively.
Figure 2C:
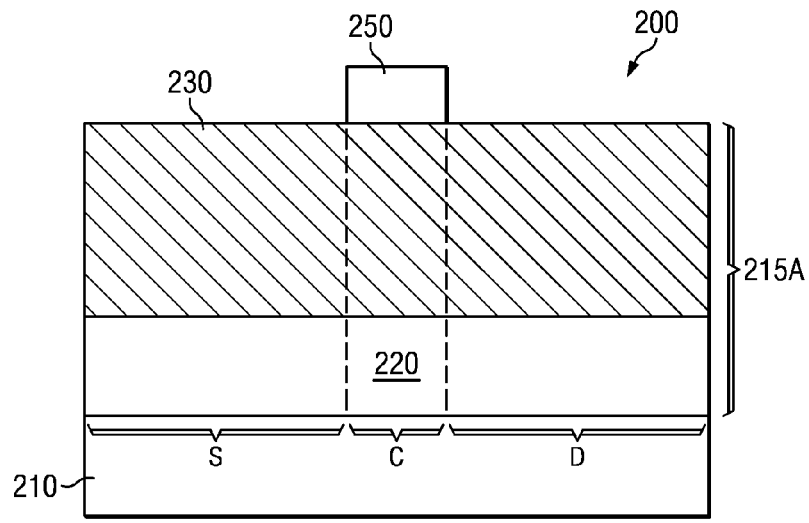
FIGS. 2C, 3C, and 4C are diagrammatic cross-sectional views along a channel of the FinFET device of FIGS. 2A, 3A, and 4A, respectively.

FIG. 2A is a perspective view of the FinFET device 200, FIG. 2B is a diagrammatic cross-sectional view of the FinFET device 200 taken along line 2B-2B in FIG. 2A, and FIG. 2C is a diagrammatic cross-sectional view of the FinFET device 200 taken along line 2C-2C in FIG. 2A. The FinFET device 200 includes a substrate (wafer) 210. In the depicted embodiment, the substrate 210 is a bulk silicon substrate. Alternatively or additionally, the substrate 210 includes an elementary semiconductor, such as silicon or germanium in a crystalline structure; a compound semiconductor, such as silicon carbide, gallium arsenic, gallium phosphide, indium phosphide, indium arsenide, and/or indium antimonide; or combinations thereof. Alternatively, the substrate 210 is a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

The FinFET device 200 includes fin structures 215A and 215B that extend from the substrate 210. In the depicted embodiment, the fin structures 215A and 215B include fin portions 220 and 230. The fin portions 220 include silicon (Si), and the fin portions 230 include silicon germanium (SiGe). A SiGe concentration of the fin portions 230 is represented by $Si_{1-x}Ge_x$, where x represents Ge composition in atomic percent. In the depicted embodiment, x is less than or equal to 1, and greater than or equal to 0. FIG. 2C is a diagrammatic cross-sectional view of the FinFET device 200 taken along the channel of the fin structure 215A, which depicts a source region S and a drain region D of the fin structure 215A. A channel C is defined between the source region S and the drain region D. The fin structure 215B similarly includes a source region, a drain region, and a channel. It is noted that the term "fin structure" in the depicted embodiment refers to individual fins of the FinFET device 200. However, the term "fin structure" may also refer to the fins collectively, and thus, fin structure may also refer to fin structures 215A and 215B collectively. Further, though the depicted embodiment illustrates two fins, the FinFET device 200 may include fewer or more fins depending on design requirements of the FinFET device 200.

The fin structures 215A and 215B, including fin portions 220 and 230, are formed by a suitable process. In one example, the fin structures 215A and 215B are formed by implementing a lithography and etching process to form the fin portion 220, and implementing an epitaxial growth process to form the fin portion 230. For example, beginning with the substrate 210, a lithography and etching process forms trenches in the substrate 210, thereby forming fin portions 220 (referred to as Si fin portions) of the fin structures 215A and 215B, which extend from the substrate 210. The lithography process may include photoresist coating (e.g., spin-on coating), soft baking, mask aligning, exposure, post-exposure baking, developing the photoresist, rinsing, drying (e.g., hard baking), other suitable processes, or combinations thereof. For example, the fin portions 220 may be formed by forming a photoresist layer (resist) overlying the substrate 210, exposing the resist to a pattern, performing a post-exposure bake process, and developing the resist to form a masking element including the resist. The masking element may then be used to etch the fin portions 220 into the silicon substrate 210. The etching process may be a dry etching process, wet etching process, other suitable etching process, or combinations thereof. For example, the fin portions 220 may be etched into the substrate 210 using a reactive ion etch (RIE). Alternatively, the lithography process could be implemented or replaced by other methods, such as maskless photolithography, electron-beam writing, ion-beam writing, and/or nanoimprint technology. The fin portions 220 may be formed by a DPL process, which is described above.

After the fin portions 220 are etched into the substrate 210, an insulation layer can be formed over the substrate 210, including over the fin portions 220. The insulation layer fills the trenches in the substrate 210. Portions of the insulation layer are then removed to form openings in the insulation layer that expose a top surface of the fin portions 220. A semiconductor material can be epitaxially (epi) grown on the exposed surfaces of the fin portions 220 to form fin portions 230 of the fin structures 215A and 215B. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin portions 220 (in other words, interact with the Si fin portions 220). In the depicted embodiment, the fin portions 230 include silicon germanium (SiGe) formed by a silicon germanium epitaxial deposition process. Alternatively, the fin portions 230 could comprise epitaxially grown silicon. The fin portions 230 may be doped during deposition (growth) by adding impurities to the source material of the epitaxy process or subsequent to its deposition growth process by an ion implantation process. For example, an epi silicon fin portion may be doped with phosphorous (to form a Si:P epi layer). The doped epitaxial layer may have a gradient doping profile. A CMP process may be performed to planarize the fin portions 230. Thereafter, the remaining insulation layer may be subjected to an etch back process, or a CMP process, thereby forming isolation features (such as isolation features 240).

In another example, the fin structures 215A and 215B are formed by implementing a lithography and etching process to form the fin portions 220, and implementing a condensation process to form the fin portions 230. The condensation process may implement the methods described in U.S. patent application Ser. No. 12/702,862, entitled Bottom-Notched SiGe FinFET Formation by Condensation Method, filed Feb. 9, 2010, which is hereby incorporated by reference in its entirety. For example, beginning with the substrate 210, a lithography and etching process forms trenches in the substrate 210, thereby forming fin portions 220 (referred to as Si fin portions) of the fin structures 215A and 215B, which extend from the substrate 210. The lithography process may be similar to that described above. Thereafter, an insulation layer can be formed over the substrate 210, filling in the trenches. The insulation layer may be subjected to an etch back process to form isolation features (such as isolation features 240). A semiconductor material is then epitaxially (epi) grown on the exposed fin portions 220. For example, SiGe is grown on the exposed fin portions 220 by an epitaxial process, similar to the epitaxial processes described above. Thereafter, a SiGe condensation process causes Ge from the SiGe material to diffuse into fin portions 220 (Si fins), forming fin portions 230. Thereafter, the isolation features may be subjected to an etch back process, or a CMP process.

Isolation features 240, such as shallow trench isolation (STI) structures, surround the fin structures 215A and 215B, isolating the fin structures 215A and 215B from each other and other not-illustrated integrated circuit devices. The isolation features 240 may be formed by partially filling trenches surrounding the fin structures 215A and 215B with an insulating material, such as silicon oxide, silicon nitride, silicon oxynitride, other suitable material, or combinations thereof. The filled trench may have a multi-layer structure, for example, a thermal oxide liner layer with silicon nitride filling the trench.

The FinFET device 200 includes a gate structure 250. The gate structure 250 traverses the fin structures 215A and 215B, and in the depicted embodiment, is formed on a central portion of the fin structures 215A and 215B. The gate structure 250 may include a gate dielectric layer and a gate electrode. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 250, such as the gate electrode, may be formed in a gate first or gate last process. The gate structure 250 may include numerous other layers, for example, capping layers, interface layers, diffusion layers, barrier layers, hard mask layers, or combinations thereof.

The gate structure 250 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Spacers may be disposed on the sidewalls of the gate structure 250, such as along the gate electrode. The spacers include a dielectric material, such as silicon oxide, silicon nitride, silicon oxynitride, other suitable material, or combinations thereof. The spacers may include a multi-layer structure, such as a multi-layer structure including a silicon nitride layer and a silicon oxide layer. The spacers are formed by a suitable process to a suitable thickness. For example, spacers may be formed by depositing silicon nitride and silicon oxide layers and then dry etching the layers to form the spacers. Before or after the spacers are formed, implantation, diffusion, and/or annealing processes may be performed to form lightly doped source and drain (LDD) features in the source and drain regions of the fin structures 215A and 215B.

Figure 3A:
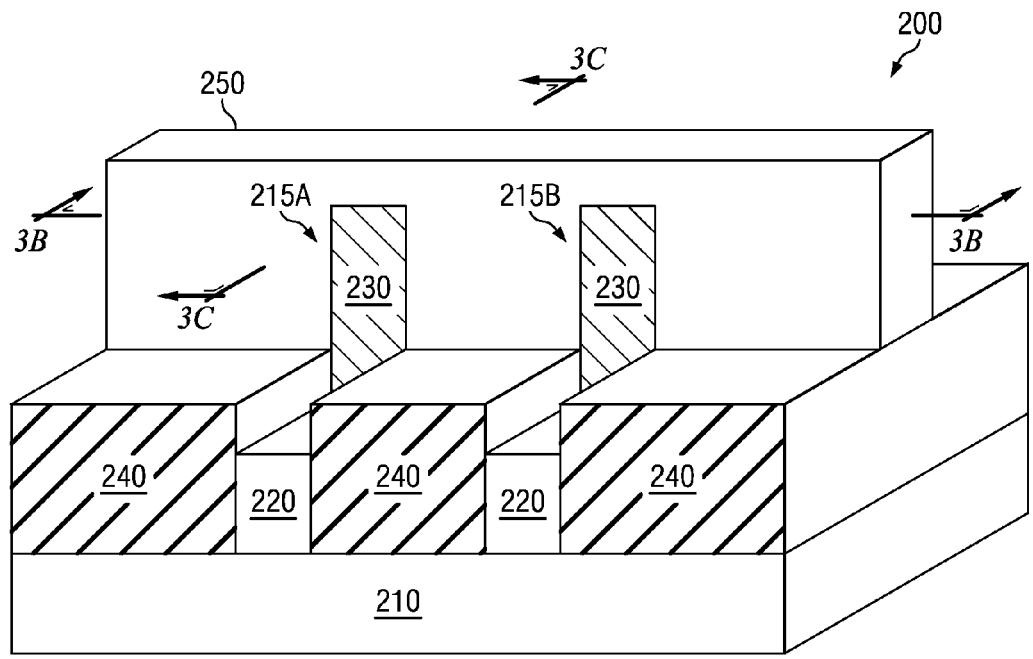
Figure 3B:
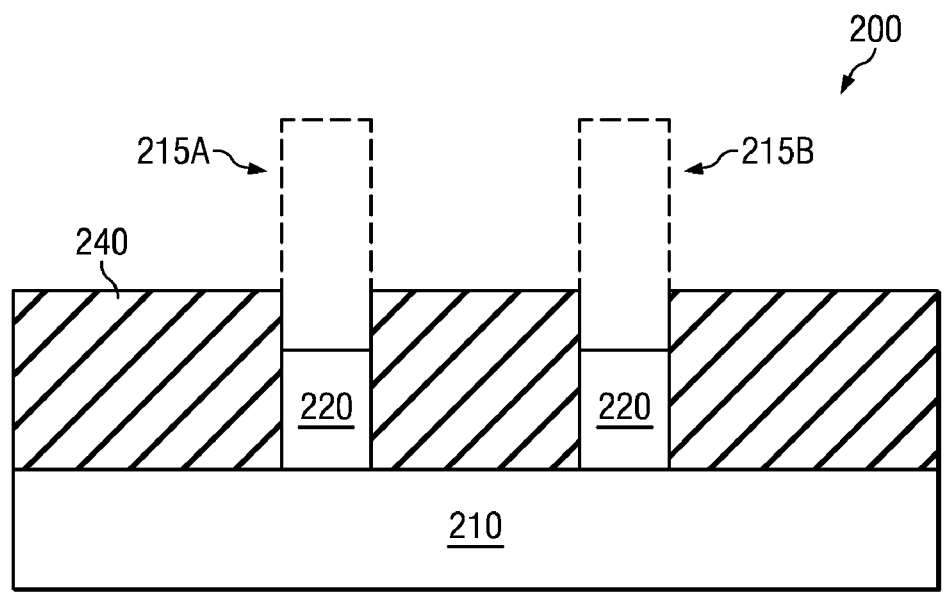
Figure 3C:
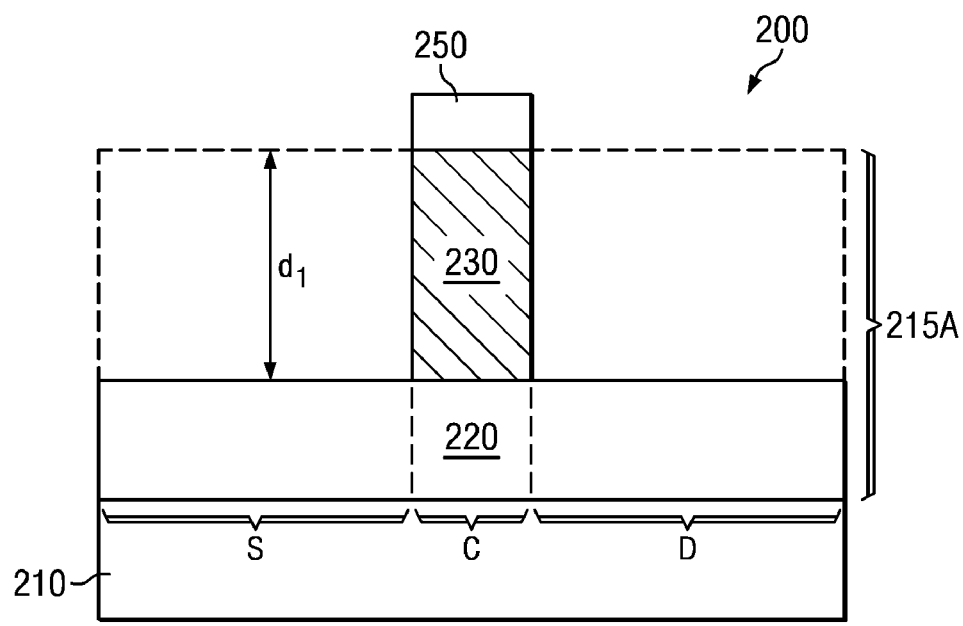

FIG. 3A is a perspective view of the FinFET device 200, FIG. 3B is a diagrammatic cross-sectional view of the FinFET device 200 taken along line 3B-3B in FIG. 3A, and FIG. 3C is a diagrammatic cross-sectional view of the FinFET device 200 taken along line 3C-3C in FIG. 3A. In FIGS. 3A-3C, the fin portion 230 is removed from the source and drain regions of the fin structures 215A and 215B. More specifically, in the depicted embodiment, an etching process completely removes the fin portions 230 from the source and drain regions of the fin structures 215A and 215B, exposing the fin portions 220. The etching process is a dry etching process, wet etching process, other etching process, or combinations thereof. In an example, the etching process uses a mixture of HBr, $Cl_2$, and $O_2$. Alternatively, other etching process mixtures may be used to effectively remove the fin portions 230 from the source and drain regions of the fin structures 215A and 215B. A radio frequency (RF) bias power of the etching process may be about 30 Watts (W) to about 400 W. A lithography and etching process may be implemented to provide a protective layer over various features of the FinFET device 200 (for example, the gate structure 250 and/or isolation features 240) to prevent the protected features from being affected by the etching process. As illustrated in FIG. 3C, the fin portion 230 remains in the channel of the fin structures 215A and 215B, confined by the gate structure 250. The removed fin portions 230 form trenches in the source and drain regions of the fins structures 215A and 215B. The trench sidewalls may be defined by fin portions 220, isolation features 240, remaining fin portion 230 in the channel region, and/or protective layer (if formed). In the depicted embodiment, a depth ($d_1$) of the trenches extends from an initial top surface of the fin portions 230 to a top, exposed surface of the fin portions 220. Where a protective layer is provided, $d_1$ may extend from a top surface of the protective layer to the top, exposed surface of the fin portions 220. Other means of determining the trench depth may be used.

Figure 4A:
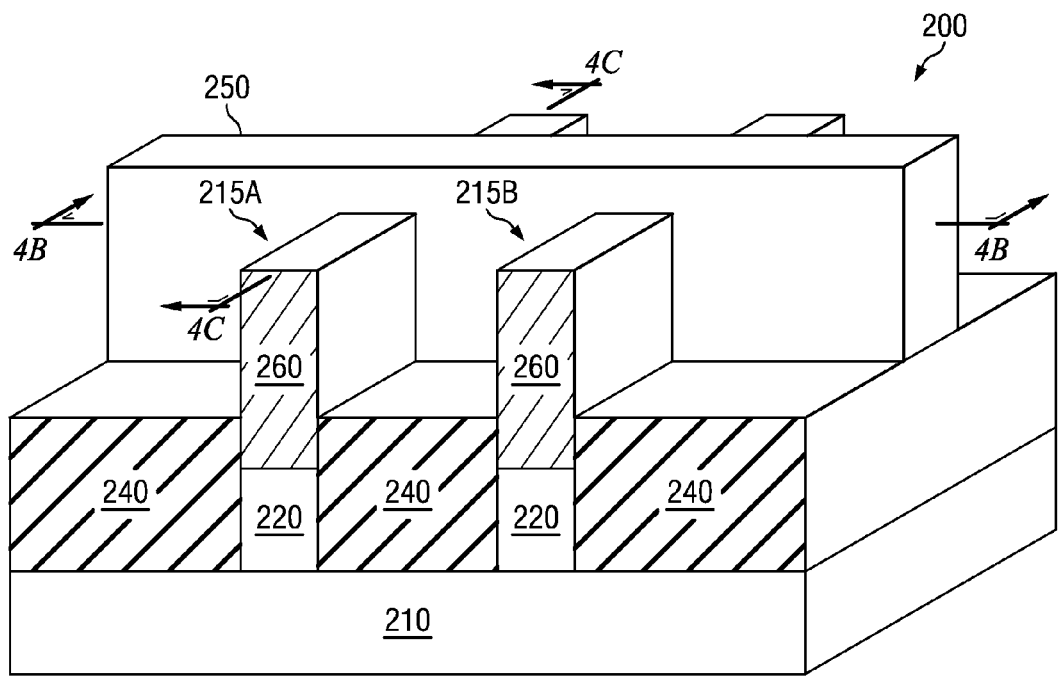
Figure 4B:
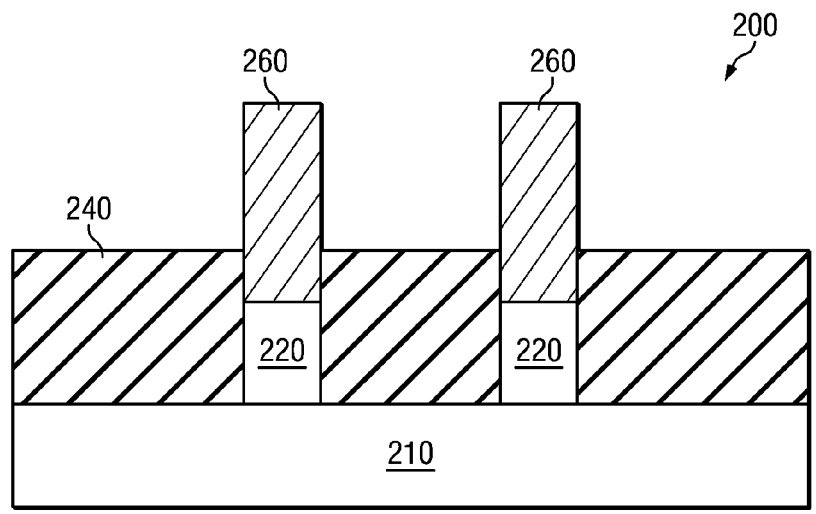
Figure 4C:
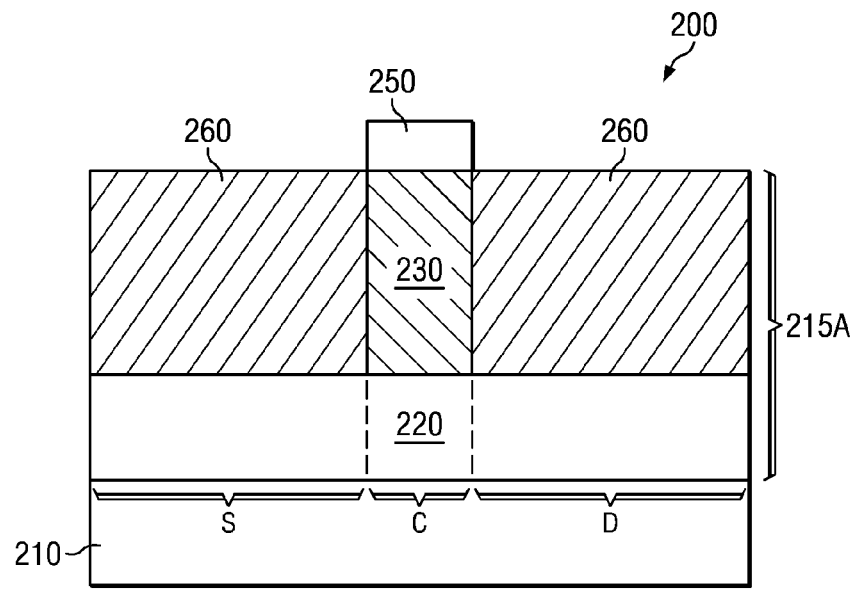

FIG. 4A is a perspective view of the FinFET device 200, FIG. 4B is a diagrammatic cross-sectional view of the FinFET device 200 taken along line 4B-4B in FIG. 4A, and FIG. 4C is a diagrammatic cross-sectional view of the FinFET device 200 taken along line 4C-4C in FIG. 4A. In FIGS. 4A-4C, fin portions 260 are formed in the source and drain regions of the fin structures 215A and 215B. For example, a semiconductor material is epitaxially (epi) grown on the exposed fin portions 220, forming fin portions 260 of the fin structures 215A and 215B. The semiconductor material can fill the trenches in the source and drain regions of the fin structures 215A and 215B. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin portions 220 (in other words, interact with the Si fin portions 220). In the depicted embodiment, the fin portions 260 include silicon germanium (SiGe) formed by a silicon germanium epitaxial deposition process. Alternatively, the fin portions 260 include epitaxially grown silicon. A SiGe concentration of the fin portion 260 is represented by $Si_{1-y}Ge_y$, where y represents Ge composition in atomic percent. In the depicted embodiment, y is less than or equal to 1, and greater than or equal to 0. The protective layer used during the etching process described above may be used during the epi process to define areas of the FinFET device 200 where the semiconductor material can grow. The fin portions 260 may be doped during deposition (growth) by adding impurities to the source material of the epitaxy process or subsequent to its deposition growth process by an ion implantation process. The doped epitaxial layer may have a gradient doping profile. A chemical mechanical polishing (CMP) process may be performed to planarize the fin portions 260. Further, before or after forming the fin portions 260, implantation, diffusion, and/or annealing processes may be performed to form heavily doped source and drain (HDD) features in the source and drain regions of the fin structures 215A and 215B.

As illustrated in FIGS. 4A-4C, the fin structures 215A and 215B include fin portions 220, fin portions 230, and fin portions 260. More specifically, the source and drain regions of the fin structures 215A and 215B include fin portions 220 and fin portions 260, and the channel of the fin structures 215A and 215B includes fin portions 220 and fin portions 230. The fin portion 230 remains in the channel of the fin structures 215A and 215B, confined by the gate structure 250 and fin portions 260. The fin portions 260 in the source and drain regions of the fin structures 215A and 215B are alternatively referred to as strained source and drain features of the FinFET device 200. The fin portions 260 provide compressive stress to the channel of the fin structures 215A and 215B, enhancing hole mobility in the PMOS FinFET device 200.

As noted above, in the depicted embodiment, fin portions 220 include Si, fin portions 230 include $Si_{1-x}Ge_x$, and fin portions 260 include $Si_{1-y}Ge_y$. Typically, PMOS FinFET devices require y to be much larger than x (y>>x) so that the source and drain regions have a much higher Ge concentration than the channel. This ensures that the strained source and drain features have a larger lattice constant than the channel to produce the desired compressive strain. Conventional manufacturing used to ensure a sufficient Ge concentration can be cost-prohibitive and often introduce complexity into existing integrated circuit device fabrication processes, such as conventional complementary metal-oxide-semiconductor (CMOS) processes. In contrast, in the depicted embodiment, fabricating integrated circuit devices according to the method 100 described above provides a FinFET device 200 with strained source and drain features where y is independent of x. In other words, the fin portions 260 may include any Ge concentration and still achieve the desired compressive strain for PMOS FinFET devices. More specifically, by forming the strained source and drain features (depicted as fin portions 260) over the Si fin portions (depicted as fin portions 220), compressive strain is achieved regardless of the channel's SiGe concentration. For example, compressive strain from the Si fin portions 220 on the $Si_{1-y}Ge_y$ fin portions 260 cause the fin portions 260 to push/stress the channel/fin portions 230, providing uniaxial stress to the channels of the fin structures 215A and 215B.

The FinFET device 200 may include additional features, which may be formed by subsequent processing. For example, silicide features may be formed in the source and drain regions of the fin structures 215A and 215B, specifically on fin portions 260. The silicide features may be formed by a silicidation process, such as a self-aligned silicide (salicide) process. Various contacts/vias/lines and multilayer interconnect features (e.g., metal layers and interlayer dielectrics) may be formed over the substrate 210, configured to connect the various features or structures of the FinFET device 200. The additional features may provide electrical interconnection to the device 200 including the gate structures 250. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

FIGS. 5A-5C, 6A-6C, and 7A-7C provide various views of another FinFET device 300, in portion or entirety, at various stages of fabrication according to the method 100 of FIG. 1. The FinFET device 300 may be included in a microprocessor, memory cell, and/or other integrated circuit device. In the depicted embodiment, the FinFET device 300 is an n-type metal-oxide-semiconductor (NMOS) FinFET device. The FinFET device 300 of FIGS. 5A-5C, 6A-6C, and 7A-7C is similar in many respects to the FinFET device 200 of FIGS. 2A-2C, 3A-3C, and 4A-4C. Accordingly, similar features in FIGS. 2A-2C, 3A-3C, 4A-4C, 5A-5C, 6A-6C, and 7A-7C are identified by the same reference numerals for clarity and simplicity. FIGS. 5A-5C, 6A-6C, and 7A-7C have been simplified for the sake of clarity to better understand the inventive concepts of the present disclosure. Additional features can be added in the FinFET device 300, and some of the features described below can be replaced or eliminated in other embodiments of the FinFET device 300.

Figure 5A:
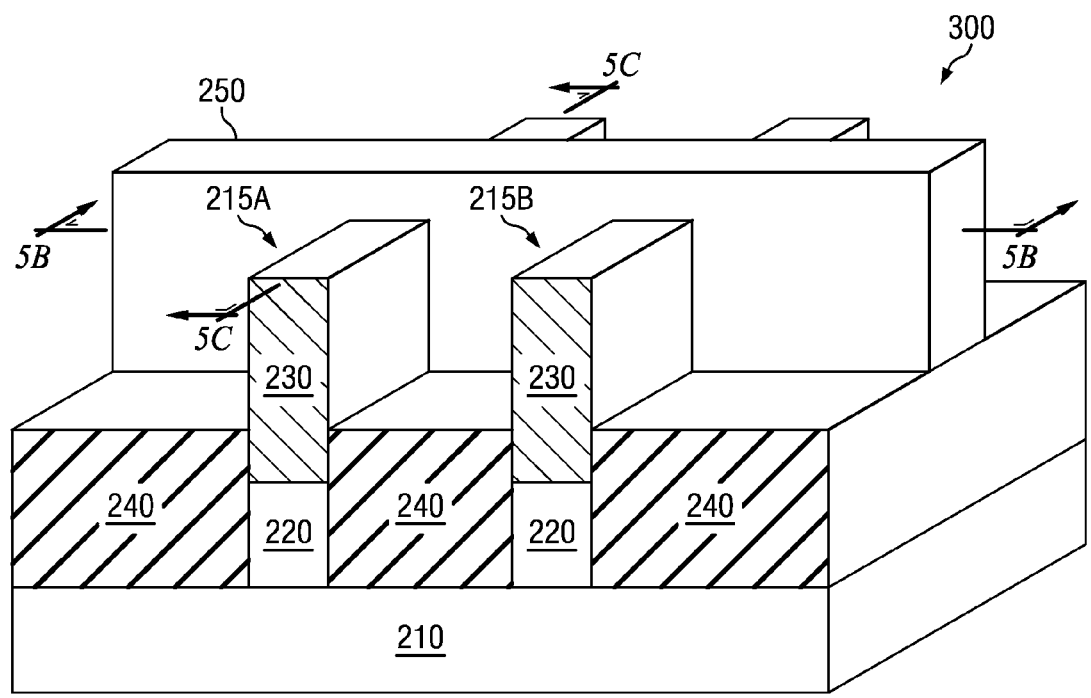
FIGS. 5A, 6A, and 7A are perspective views of another FinFET device at various fabrication stages according to the method of FIG. 1.
Figure 5B:
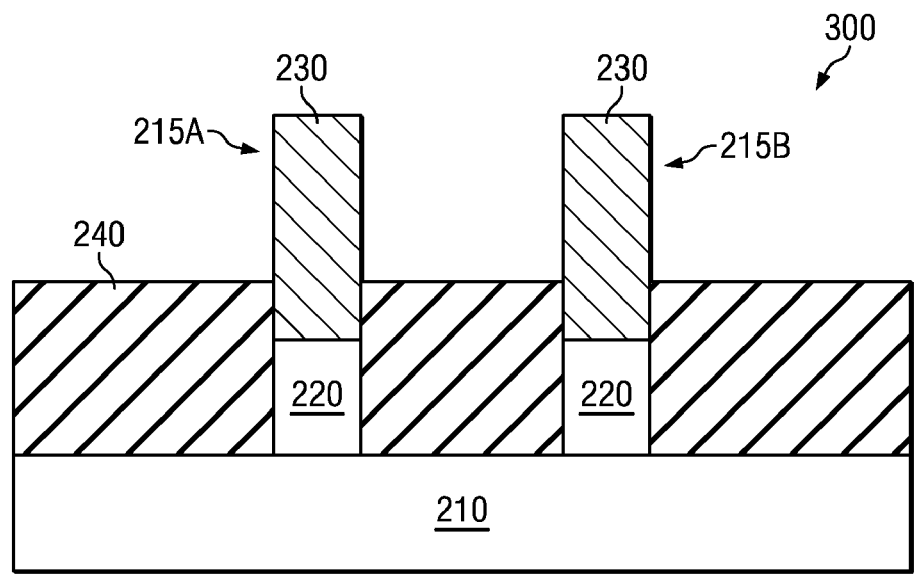
FIGS. 5B, 6B, and 7B are diagrammatic cross-sectional views of the FinFET device of FIGS. 5A, 6A, and 7A, respectively.
Figure 5C:
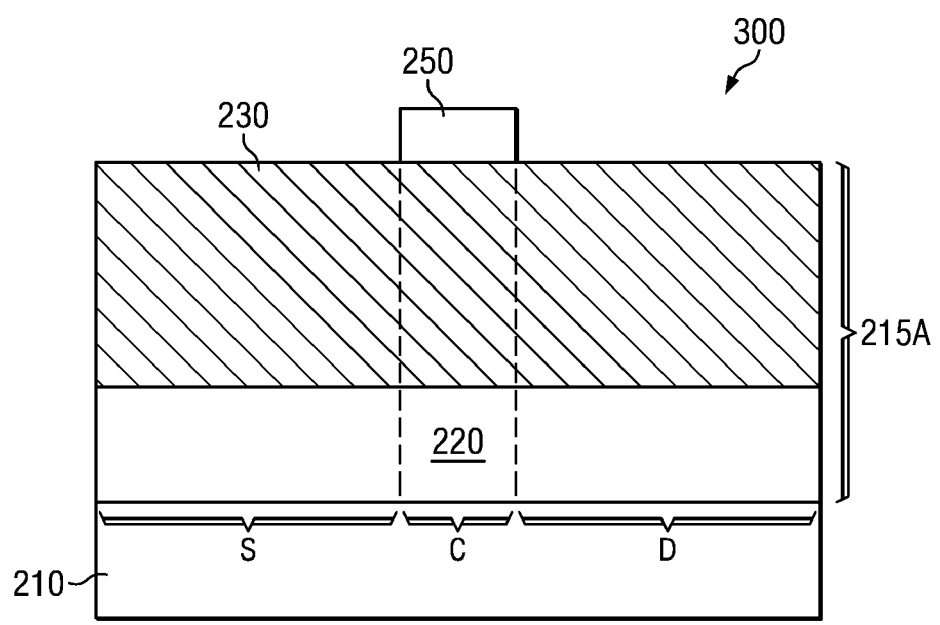
FIGS. 5C, 6C, and 7C are diagrammatic cross-sectional views along a channel of the FinFET device of FIGS. 5A, 6A, and 7A, respectively.

FIG. 5A is a perspective view of the FinFET device 300, FIG. 5B is a diagrammatic cross-sectional view of the FinFET device 300 taken along line 5B-5B in FIG. 5A, and FIG. 5C is a diagrammatic cross-sectional view of the FinFET device 300 taken along line 5C-5C in FIG. 5A. The FinFET device 300 includes the substrate 210, fin structures 215A and 215B including fin portions 220 and 230, isolation features 240, and gate structure 250.

Figure 6A:
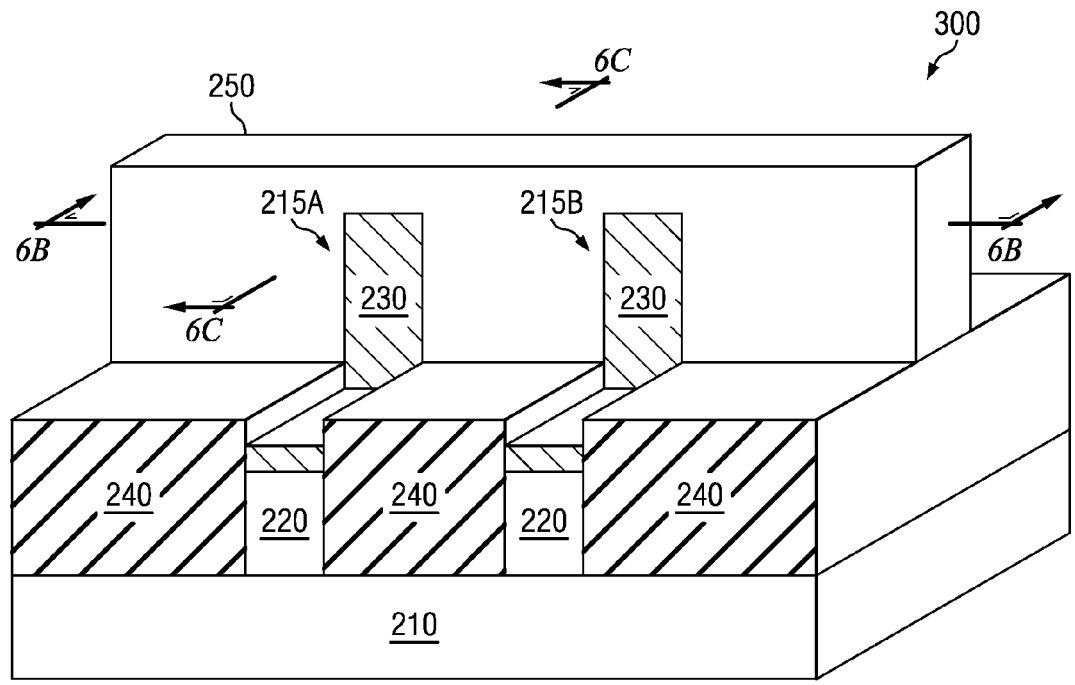
Figure 6B:
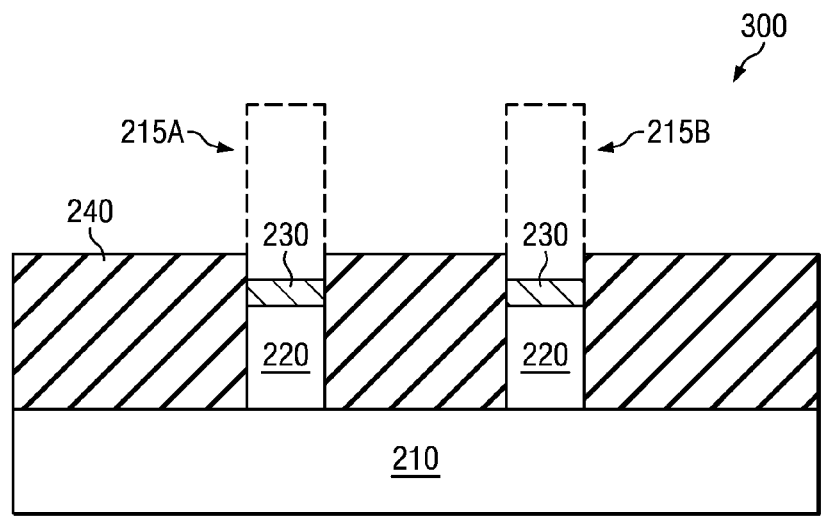
Figure 6C:
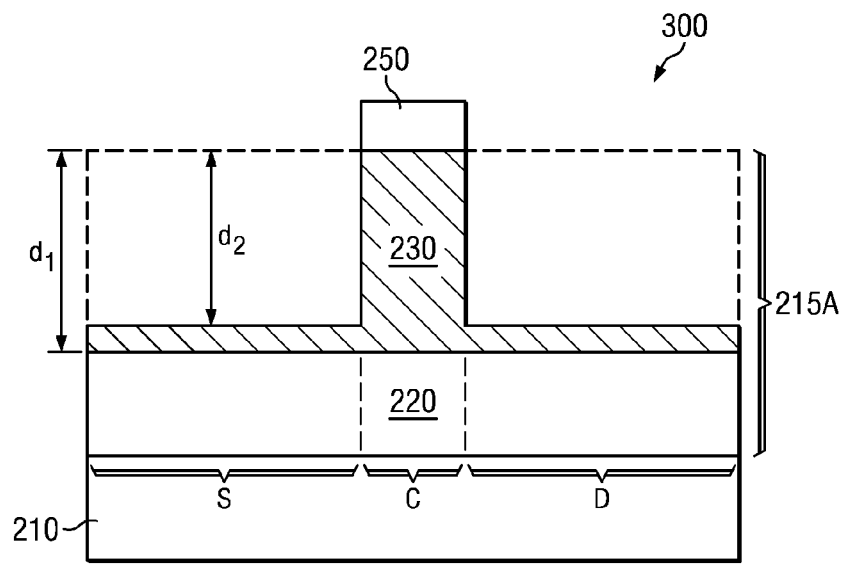

FIG. 6A is a perspective view of the FinFET device 300, FIG. 6B is a diagrammatic cross-sectional view of the FinFET device 300 taken along line 6B-6B in FIG. 6A, and FIG. 6C is a diagrammatic cross-sectional view of the FinFET device 300 taken along line 6C-6C in FIG. 6A. In FIGS. 6A-6C, the fin portion 230 is removed from the source and drain regions of the fin structures 215A and 215B. In contrast to the FinFET device 200 of FIGS. 3A-3C, in the depicted embodiment, an etching process partially removes the fin portions 230 from the source and drain regions of the fin structures 215A and 215B, such that some of the fin portions 230 remains in the source and drain regions. The etching process is a dry etching process, wet etching process, other etching process, or combinations thereof. In an example, the etching process uses a mixture of HBr, $Cl_2$, and $O_2$. Alternatively, other etching process mixtures may be used to effectively partially remove the fin portions 230 from the source and drain regions of the fin structures 215A and 215B. A radio frequency (RF) bias power of the etching process may be about 30 Watts (W) to about 400 W. A lithography and etching process may be implemented to provide a protective layer over various features of the FinFET device 300 (for example, the gate structure 250 and/or isolation features 240) to prevent the protected features from being affected by the etching process. The removed fin portions 230 form trenches in the source and drain regions of the fins structures 215A and 215B. The trench sidewalls may be defined by remaining fin portions 230 (in the source, drain, and channel regions), isolation features 240, and/or protective layer (if formed). In the depicted embodiment, a depth ($d_2$) of the trenches extends from an initial top surface of the fin portions 230 to a top, exposed surface of the fin portions 230. Where a protective layer is provided, $d_2$ may extend from a top surface of the protective layer to the top, exposed surface of the fin portions 230. The depth $d_1$ indicates the depth of the trenches in the source and drain regions of the FinFET device 300. Considering $d_1$ and $d_2$, the FinFET device 200 has a deeper trench (or recess) than the FinFET device 300. As will be described further below, the trench depth can be controlled to achieve various source and drain features for the fin structures, such that different kinds of channel strain can be achieved for different FinFET devices.

Figure 7A:
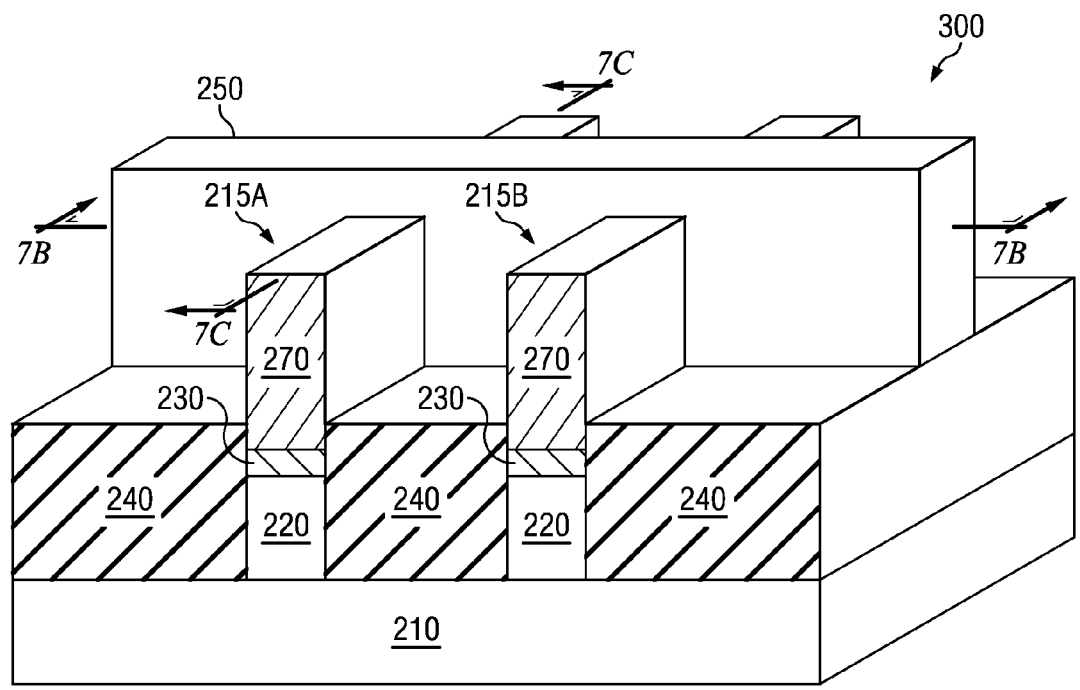
Figure 7B:
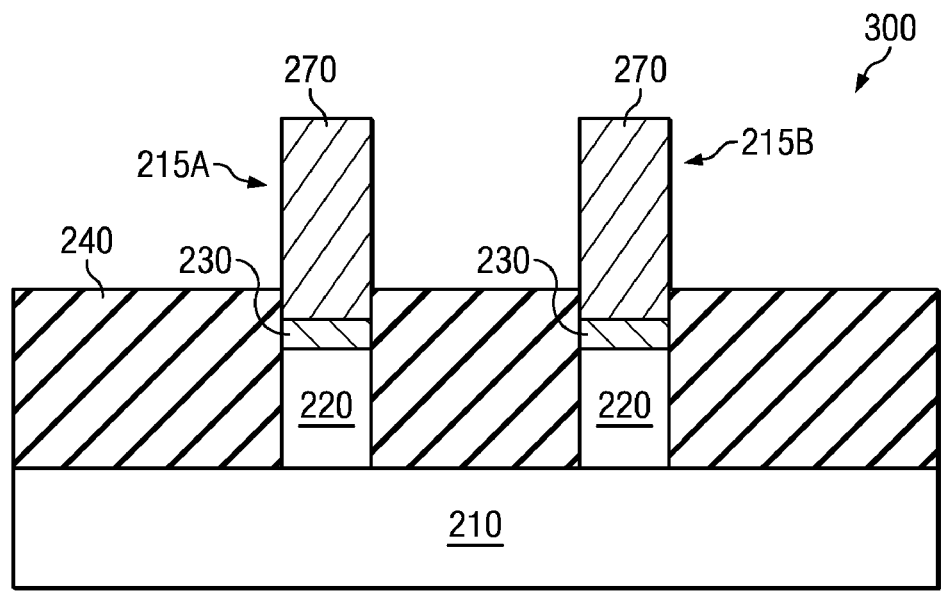
Figure 7C:
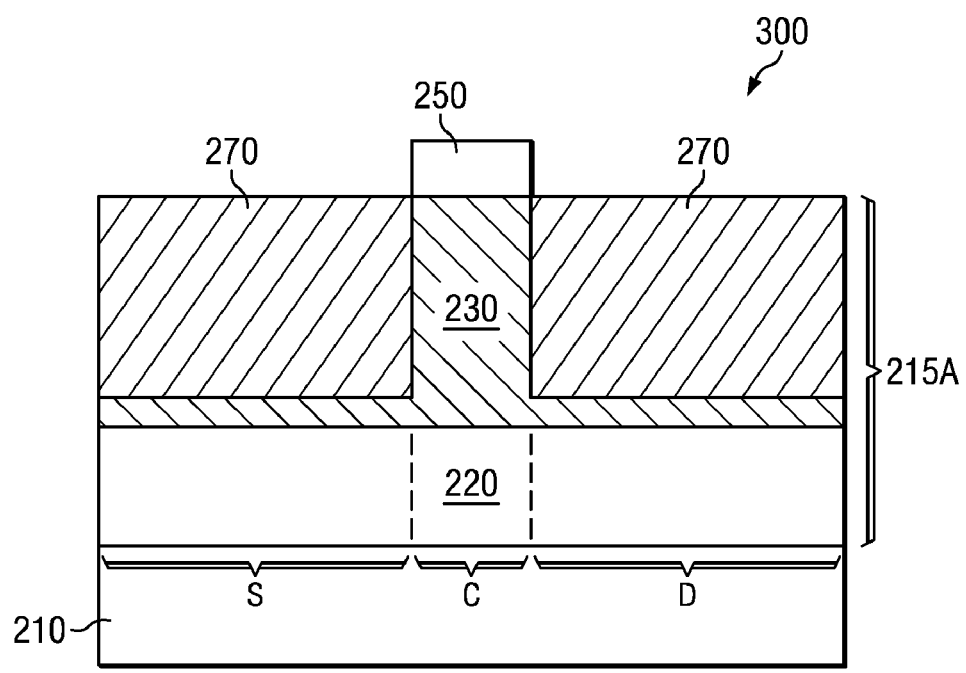

FIG. 7A is a perspective view of the FinFET device 300, FIG. 7B is a diagrammatic cross-sectional view of the FinFET device 300 taken along line 7B-7B in FIG. 7A, and FIG. 7C is a diagrammatic cross-sectional view of the FinFET device 300 taken along line 7C-7C in FIG. 7A. In FIGS. 7A-7C, fin portions 270 are formed in the source and drain regions of the fin structures 215A and 215B. For example, a semiconductor material is epitaxially (epi) grown on the exposed fin portions 230 in the source and drain regions, forming fin portions 270 of the fin structures 215A and 215B. The semiconductor material can fill the trenches in the source and drain regions of the fins structures 215A and 215B. The epitaxy process may use CVD deposition techniques (e.g., VPE and/or UHV-CVD), molecular beam epitaxy, and/or other suitable processes. The epitaxy process may use gaseous and/or liquid precursors. In the depicted embodiment, the fin portions 270 include silicon germanium (SiGe) formed by a silicon germanium epitaxial deposition process. Alternatively, the fin portions 270 include epitaxially grown silicon. A SiGe concentration of the fin portions 270 is represented by $Si_{1-z}Ge_z$, where z represents Ge composition in atomic percent. In the depicted embodiment, z is less than or equal to 1, and greater than or equal to 0. The protective layer used during the etching process described above may be used during the epi process to define areas of the FinFET device 300 where the semiconductor material can grow. The fin portions 270 may be doped during deposition (growth) by adding impurities to the source material of the epitaxy process or subsequent to its deposition growth process by an ion implantation process. For example, an epi silicon fin portion may be doped with phosphorous (to form a Si:P epi layer). The doped epitaxial layer may have a gradient doping profile. A CMP process may be performed to planarize the fin portions 270. Further, before or after forming the fin portions 230 and/or 270, implantation, diffusion, and/or annealing processes may be performed to form HDD features in the source and drain regions of the fin structures 215A and 215B.

As illustrated in FIGS. 7A-7C, the fin structures 215A and 215B include fin portions 220, fin portions 230, and fin portions 270. More specifically, the source and drain regions of the fin structures 215A and 215B include fin portions 220, 230, and 270, and the channel of the fin structures 215A and 215B includes fin portions 220 and 230. The fin portions 230 and 270 in the source and drain regions of the fin structures 215A and 215B are alternatively referred to as strained source and drain features of the FinFET device 300. The depicted fin portions 270 provide tensile stress to the channel of the fins structures 215A and 215B, enhancing electron mobility in the channel of the NMOS FinFET device 300. In the depicted embodiment, fin portions 220 include Si, fin portions 230 include $Si_{1-x}Ge_x$, and fin portions 270 include $Si_{1-z}Ge_z$, where z is less than x.

The FinFET device 300 may include additional features, which may be formed by subsequent processing. For example, silicide features may be formed in the source and drain regions of the fin structure fin structures 215A and 215B, specifically on fin portions 270. The silicide features may be formed by a silicidation process, such as a self-aligned silicide (salicide) process. Various contacts/vias/lines and multilayer interconnect features (e.g., metal layers and interlayer dielectrics) may be formed over the substrate 210, configured to connect the various features or structures of the FinFET device 300. The additional features may provide electrical interconnection to the device 300 including the gate structures 250. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The PMOS FinFET device 200 and NMOS FinFET device 300 can be fabricated in a single integrated circuit device using the method 100. By controlling the source and drain trench depth (for example, $d_1$ and $d_2$), where the strained source and drain features (fin portions 260 or fin portions 230 and 270) will be formed, strain for both PMOS and NMOS FinFET devices can be achieved. For example, as described above, fin portions 230 are completely removed from the source and drain regions of the fin structures 215A and 215B in FinFET device 200, yet are partially removed from the source and drain regions of the fin structures 215A and 215B in FinFET device 300. This provides different starting substrates for forming the epi/strained source and drain features, such that different types of strain can be achieved for the different device types. Accordingly, the trench depth can be tuned to independently optimize performance of each FinFET device in an integrated circuit device. Further, the fin portions 260 and fin portions 270 can be formed simultaneously, such that the fin portions 260 and 270 have a same SiGe composition.

Figure 8:
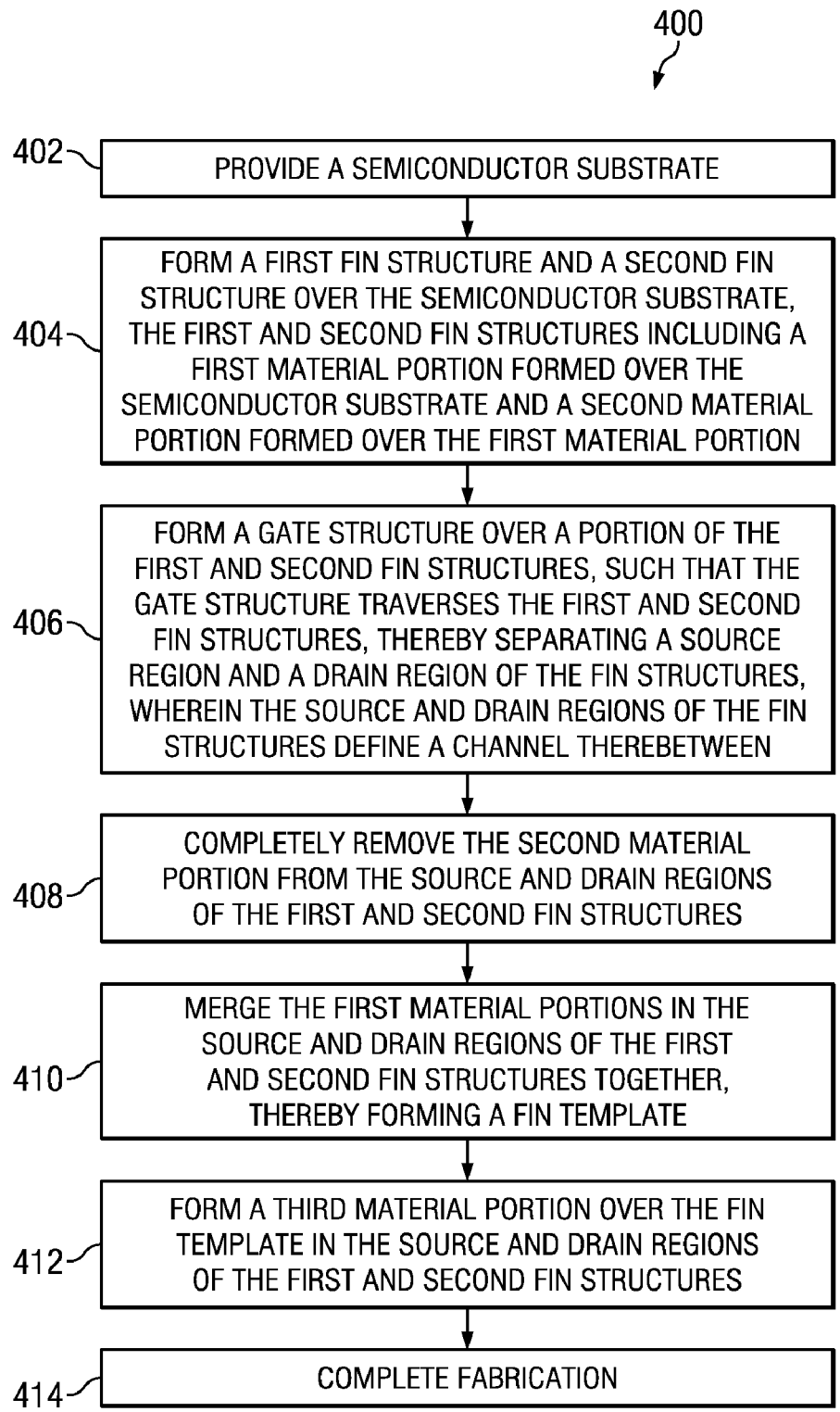
FIG. 8 is a flow chart of another method for fabricating a FinFET device according to aspects of the present disclosure.

FIG. 8 is a flow chart of a method 400 for fabricating an integrated circuit device according to various aspects of the present disclosure. In the depicted embodiment, the method 400 fabricates an integrated circuit device that includes a FinFET device. The method 400 begins at block 402 where a semiconductor substrate is provided. At block 404, a first fin structure and a second fin structure is formed over the semiconductor substrate. More specifically, a first material portion of the first and second fin structures is formed over the semiconductor substrate, and a second material portion of the first and second fin structures is formed over the first material portion. At block 406, a gate structure is formed over a portion of the first and second fin structures. The gate structure traverses the first and second fin structures, separating a source region and a drain region of the first and second fin structures. A channel is defined between the source and drain regions of the first and second fin structures. At block 408, the second material portion is completely removed from the source and drain regions of the first and second fin structures. At block 410, the first material portions in the source and drain regions of the first and second fin structures are merged together to form a fin template. At block 412, a third material portion is formed over the fin template in the source and drain regions of the first and second fin structures. The method 400 continues with block 414 where fabrication of the integrated circuit device is completed. Additional steps can be provided before, during, and after the method 400, and some of the steps described can be replaced or eliminated for other embodiments of the method.

FIGS. 9A-9C, 10A-10C, 11A-11C, and 12A-12C provide various views of a FinFET device 500, in portion or entirety, at various stages of fabrication according to the method 400 of FIG. 8. The FinFET device 500 may be included in a microprocessor, memory cell, and/or other integrated circuit device. In the depicted embodiment, the FinFET device 500 is a PMOS FinFET device. The FinFET device 500 of FIGS. 9A-9C, 10A-10C, 11A-11C, and 12A-12C is similar in many respects to the FinFET device 200 of FIGS. 2A-2C, 3A-3C, and 4A-4C. Accordingly, similar features in FIGS. 2A-2C, 3A-3C, 4A-4C, 9A-9C, 10A-10C, 11A-11C, and 12A-12C are identified by the same reference numerals for clarity and simplicity. FIGS. 9A-9C, 10A-10C, 11A-11C, and 12A-12C have been simplified for the sake of clarity to better understand the inventive concepts of the present disclosure. Additional features can be added in the FinFET device 500, and some of the features described below can be replaced or eliminated in other embodiments of the FinFET device 500.

Figure 9A:
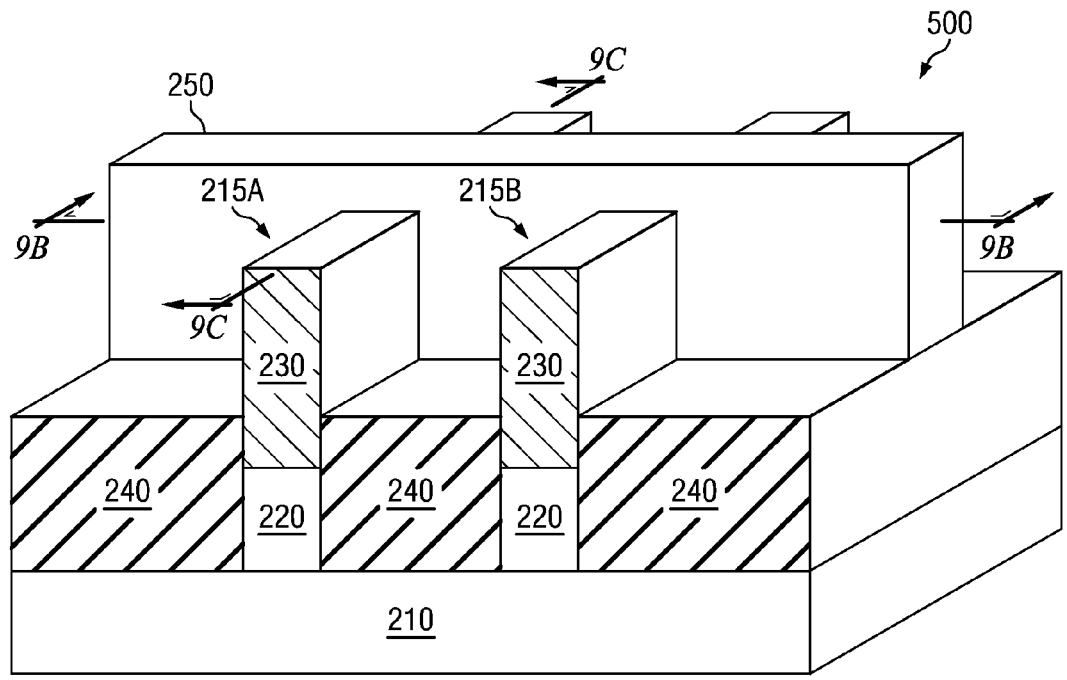
FIGS. 9A, 10A, 11A, and 12A are perspective views of a FinFET device at various fabrication stages according to the method of FIG. 8.
Figure 9B:
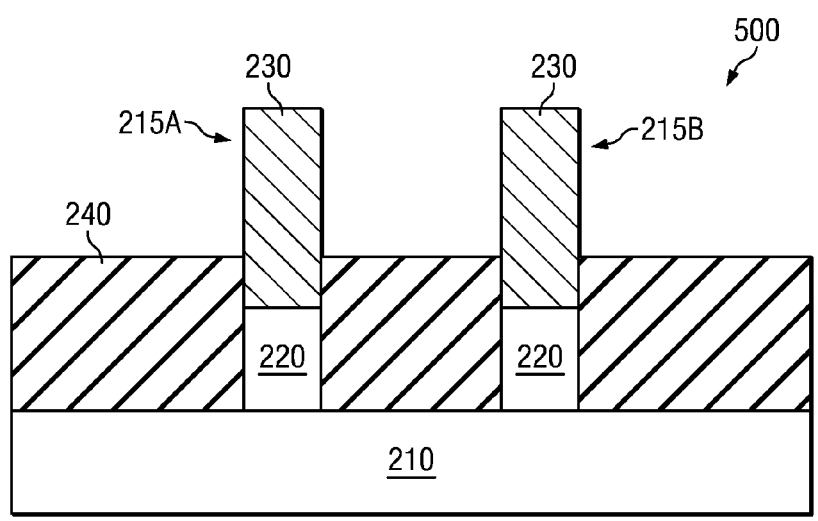
FIGS. 9B, 10B, 11B, and 12B are diagrammatic cross-sectional views of the FinFET device of FIGS. 9A, 10A, 11A, and 12A, respectively.
Figure 9C:
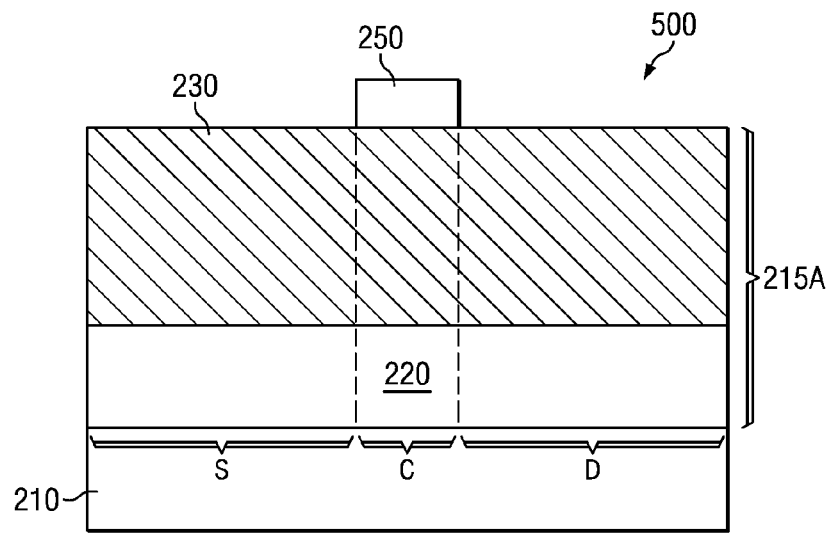
FIGS. 9C, 10C, 11C, and 12C are diagrammatic cross-sectional views along a channel of the FinFET device of FIGS. 9A, 10A, 11A, and 12A, respectively.

FIG. 9A is a perspective view of the FinFET device 500, FIG. 9B is a diagrammatic cross-sectional view of the FinFET device 500 taken along line 9B-9B in FIG. 9A, and FIG. 9C is a diagrammatic cross-sectional view of the FinFET device 500 taken along line 9C-9C in FIG. 9A. The FinFET device 500 includes the substrate 210, fin structures 215A and 215B including fin portions 220 and 230, isolation features 240, and gate structure 250. The fin structures 215A and 215B include a source region and a drain region, and the source and drain regions define a channel region therebetween.

Figure 10A:
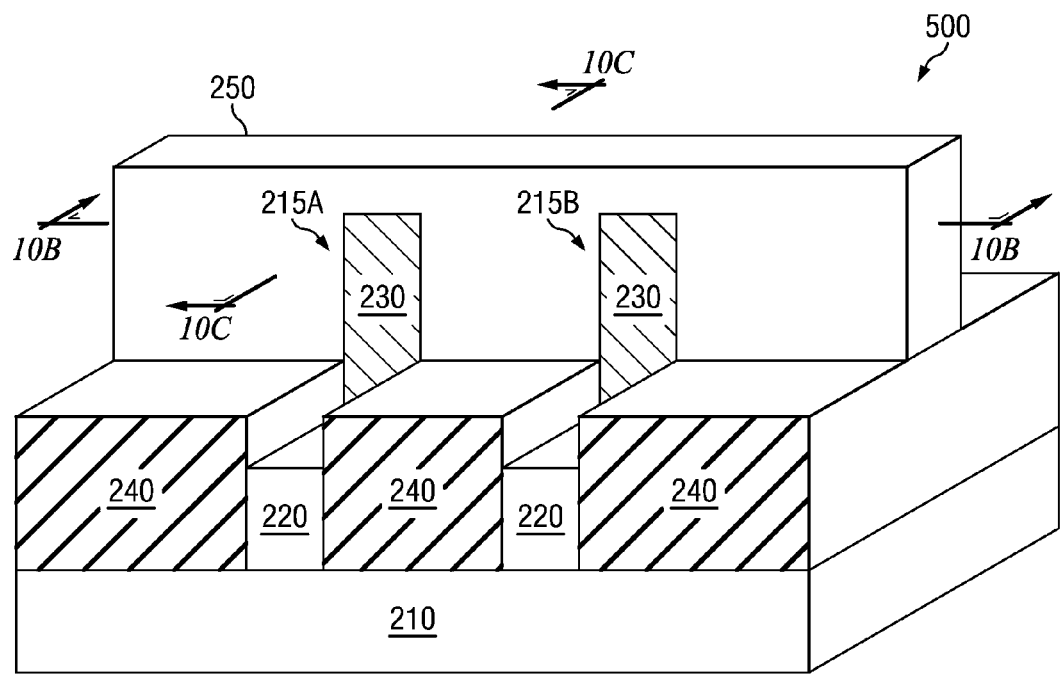
Figure 10B:
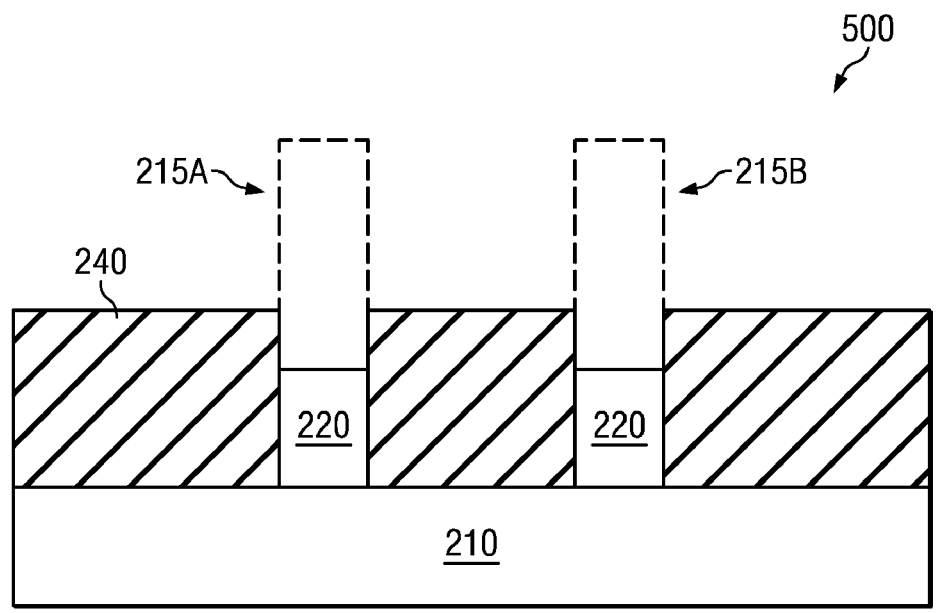
Figure 10C:
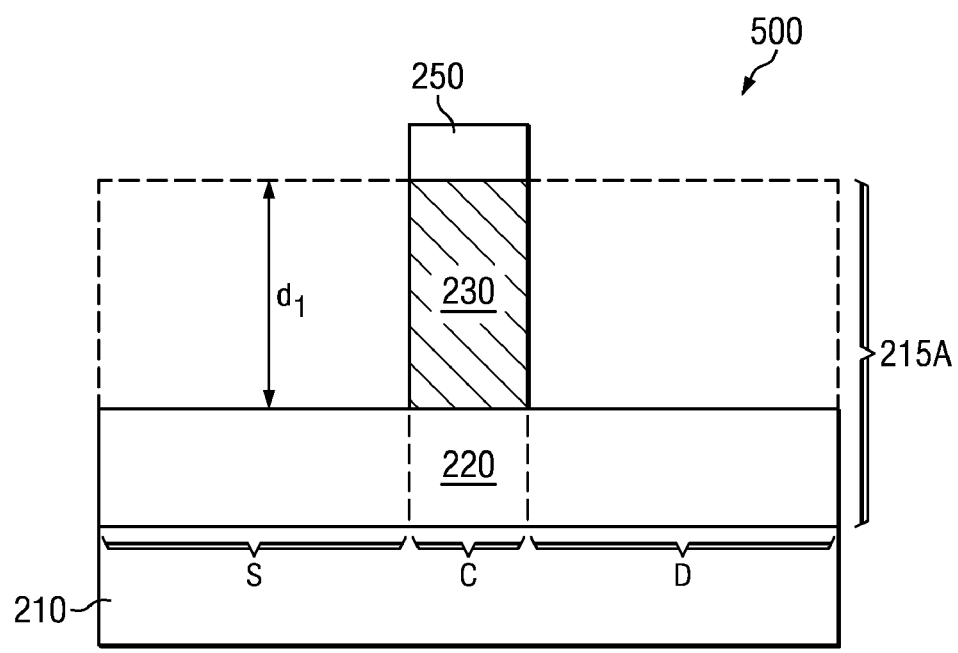

FIG. 10A is a perspective view of the FinFET device 500, FIG. 10B is a diagrammatic cross-sectional view of the FinFET device 500 taken along line 10B-10B in FIG. 10A, and FIG. 10C is a diagrammatic cross-sectional view of the FinFET device 500 taken along line 10C-10C in FIG. 10A. As described above with reference to FIGS. 3A-3C, in FIGS. 10A-10C, the fin portions 230 are completely removed from the source and drain regions of the fins structures 215A and 215B, exposing fin portions 220 in the source and drain regions.

Figure 11A:
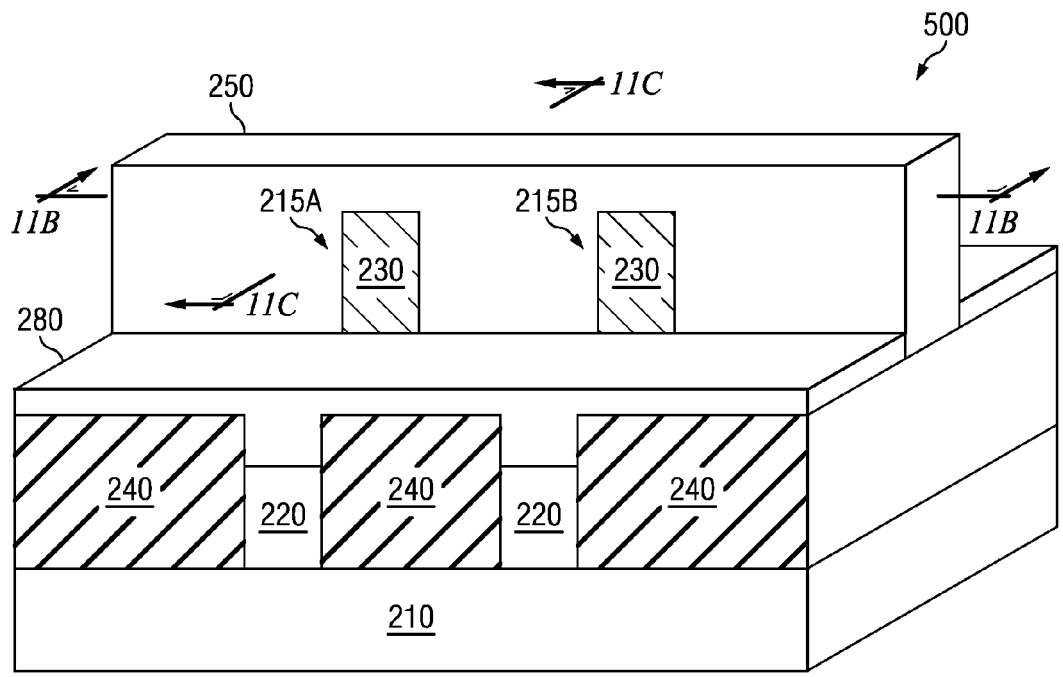
Figure 11B:
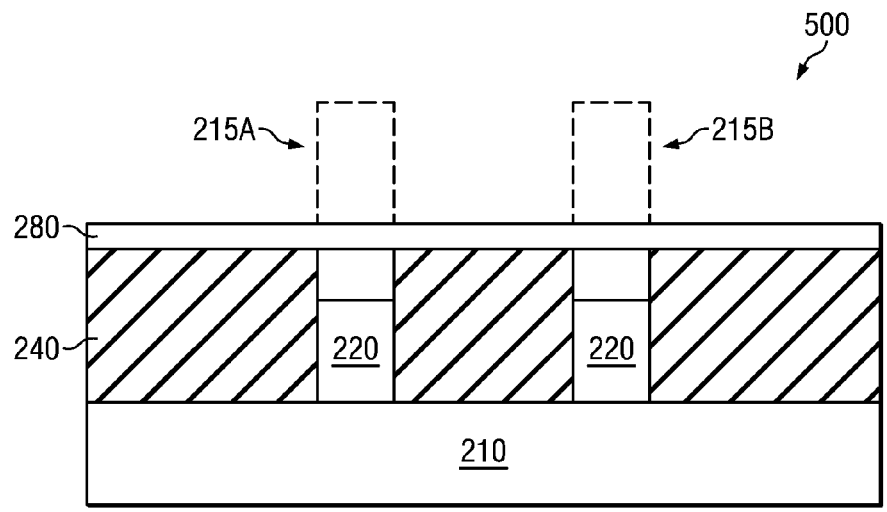
Figure 11C:
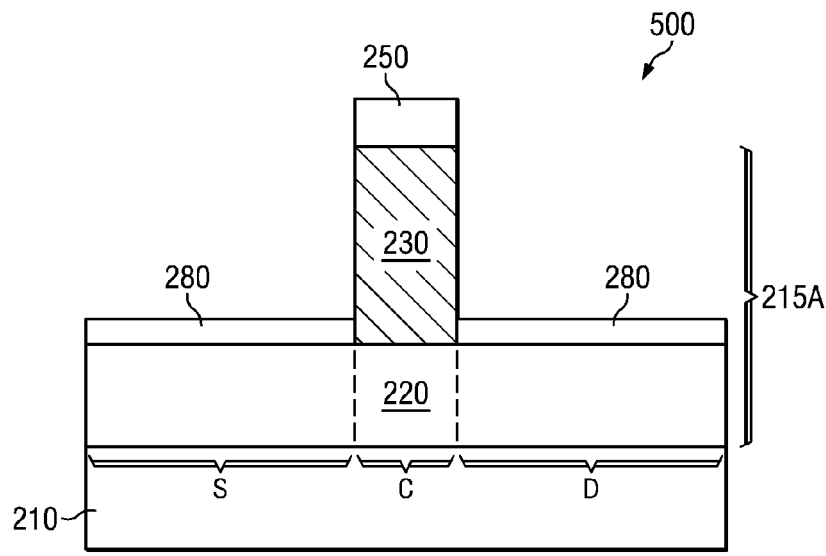

FIG. 11A is a perspective view of the FinFET device 500, FIG. 11B is a diagrammatic cross-sectional view of the FinFET device 500 taken along line 11B-11B in FIG. 11A, and FIG. 11C is a diagrammatic cross-sectional view of the FinFET device 500 taken along line 11C-11C in FIG. 11A. In FIGS. 11A-11C, the fin portions 220 in the source and drain regions of the fin structures 215A and 215B are merged together to form a fin template 280. For example, the fin template 280 may be formed by a process similar to that described in U.S. Ser. patent application Ser. No. 12/917,902, filed Nov. 2, 2010, entitled Fin-Like Field Effect Transistor (FinFET) Device and Method of Manufacturing Same. In the depicted embodiment, a semiconductor material is epitaxially (epi) grown on the exposed fin portions 220 in the source and drain regions, until the fin portions 220 of the fin structures 215A and 215B are merged together to form the fin template 280. The epitaxy process may use CVD deposition techniques (e.g., VPE and/or UHV-CVD), molecular beam epitaxy, and/or other suitable processes. The epitaxy process may use gaseous and/or liquid precursors. In the depicted embodiment, the fin template 280 includes silicon formed by a silicon epitaxial deposition process. Alternatively, the fin template 280 could include germanium (SiGe) formed by a silicon germanium epitaxial deposition process. The fin template 280 may be doped during deposition (growth) by adding impurities to the source material of the epitaxy process or subsequent to its deposition growth process by an ion implantation process. For example, an epi silicon fin portion may be doped with phosphorous (to form a Si:P epi layer). The doped epitaxial layer may have a gradient doping profile. A CMP process may be performed to planarize the fin template 280. Though the fin template 280 and fin portions 220 are depicted separately, it is understood that "fin template" can refer to the newly grown epi semiconductor material alone (depicted as fin template 280) or the newly grown epi semiconductor material combined with the initial fin portions (depicted as fin portions 220). The fin template 280 can minimize stress relaxation along a width of the fin structures 215A and 215B, maximizing strain to the channels of fin structures 215A and 215B and enhancing device performance.

Figure 12A:
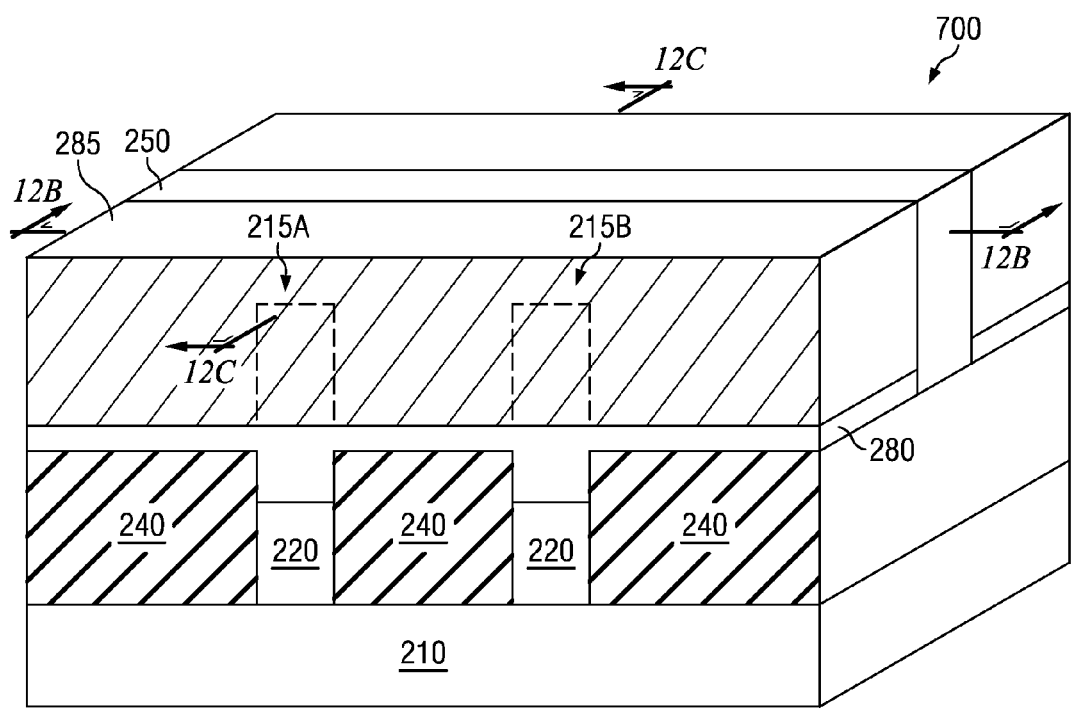
Figure 12B:
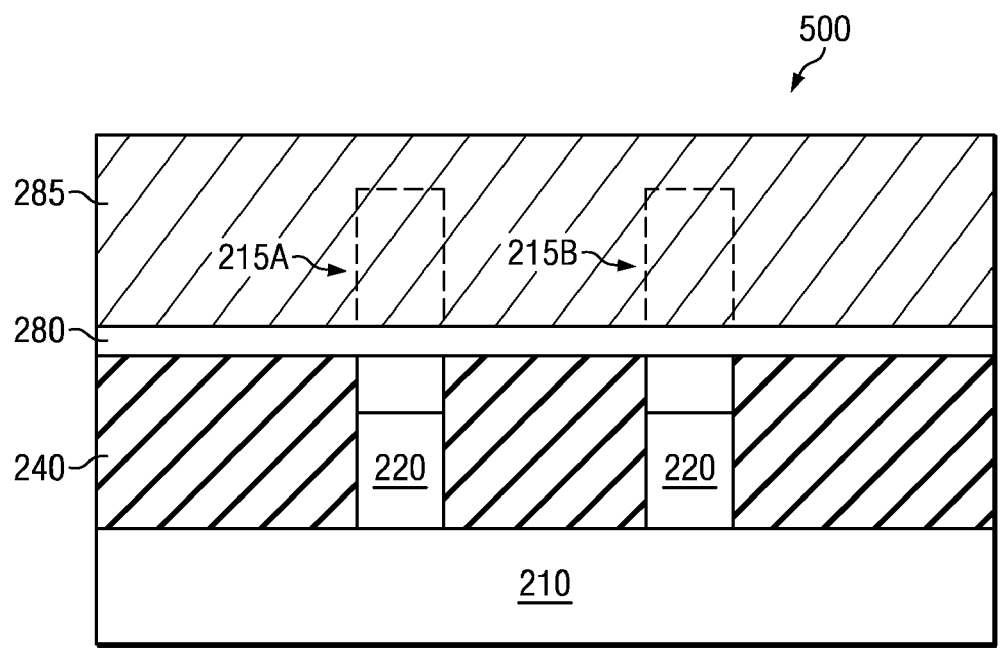
Figure 12C:
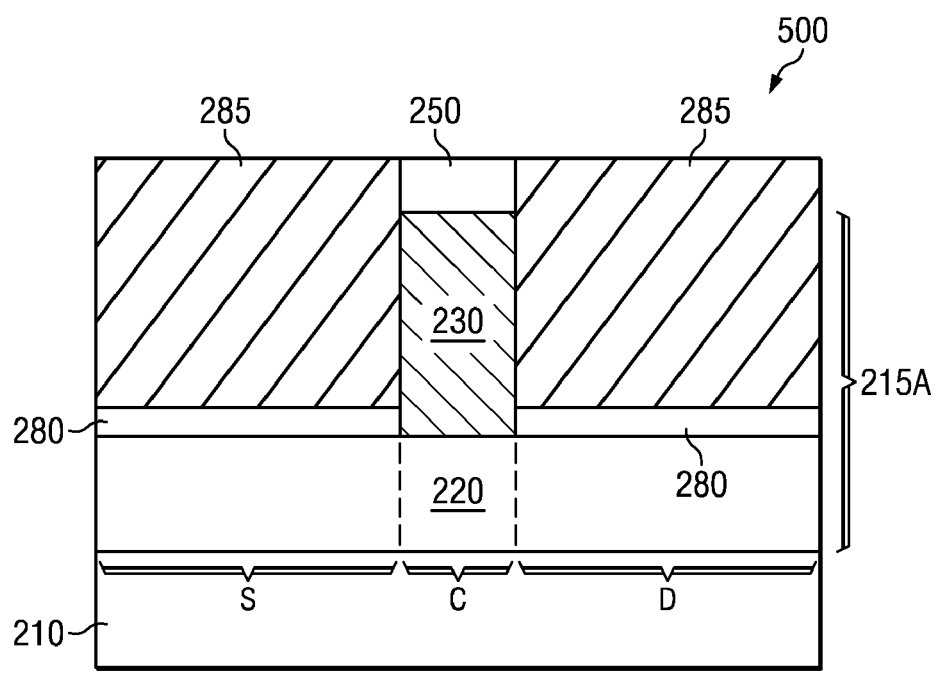

FIG. 12A is a perspective view of the FinFET device 500, FIG. 12B is a diagrammatic cross-sectional view of the FinFET device 500 taken along line 12B-12B in FIG. 12A, and FIG. 12C is a diagrammatic cross-sectional view of the FinFET device 500 taken along line 12C-12C in FIG. 12A. In FIGS. 12A-12C, a fin portion 285 is formed over the fin template 280, providing the fin structures 215A and 215B with the fin portion 285. For example, a semiconductor material is epitaxially (epi) grown on the fin template 285. The epitaxy process may use CVD deposition techniques (e.g., VPE and/or UHV-CVD), molecular beam epitaxy, and/or other suitable processes. The epitaxy process may use gaseous and/or liquid precursors, which interact with the composition of the fin template 280 (in other words, interact with the Si fin template 280). In the depicted embodiment, the fin portion 285 is silicon germanium (SiGe) formed by a silicon germanium epitaxial deposition process. The SiGe concentration of the fin portion 285 is represented by $Si_{1-y}Ge_y$, where y represents Ge composition in atomic percent. In the depicted embodiment, y is less than or equal to 1, and greater than or equal to 0. The fin portion 285 may be doped during deposition (growth) by adding impurities to the source material of the epitaxy process or subsequent to its deposition growth process by an ion implantation process. The doped epitaxial layer may have a gradient doping profile. A CMP process may be performed to planarize the fin portion 285. Further, before or after forming the fin portion 285, implantation, diffusion, and/or annealing processes may be performed to form HDD features in the source and drain regions of the fin structures 215A and 215B.

As illustrated in FIGS. 12A-12C, the fin structures 215A and 215B include fin portions 220, fin portions 230, fin template 280, and fin portions 285. More specifically, the source and drain regions of the fin structures 215A and 215B include fin portions 220, fin template 280, and fin portions 285. The channel of the fin structures 215A and 215B includes fin portions 220 and fin portions 230. The fin portion 230 remains in the channel region of the fin structures 215A and 215B, confined by the gate structure 250, fin template 280, and fin portions 285. The fin template 280 and/or fin portions 285 in the source and drain regions of the fin structures 215A and 215B are alternatively referred to as strained source and drain features of the FinFET device 500. In the depicted embodiment, fin portions 220 include Si, fin template 280 includes Si, fin portions 230 include $Si_{1-x}Ge_x$, and fin portions 285 include $Si_{1-y}Ge_y$. The fin portions 285 provide compressive stress to the channel of the fin structures 215A and 215B, enhancing hole mobility in the PMOS FinFET device 500. Similar to PMOS FinFET device 200 described above, y is independent of x in PMOS FinFET device 500. The fin portions 285 may include any Ge concentration and still achieve the compressive strain desired for PMOS FinFET devices. By forming the fin portions 285 over the Si fin portions (fin template 280), compressive strain is achieved regardless of the SiGe concentration of the channel. Accordingly, the fin portions 285 may include any Ge concentration and still achieve the compressive strain desired for PMOS FinFET devices. By forming the fin portions 285 over the Si fin portions (fin template 280), compressive strain is achieved regardless of the SiGe concentration of the channel. For example, compressive strain from the Si fin template 280 on the $Si_{1-y}Ge_y$ fin portions 285 cause the fin portions 285 to push/stress the channel/fin portions 230, providing uniaxial stress to the channel of the FinFET device 500. In contrast to FinFET device 200, the fin template 280 of FinFET device 500 can minimize stress relaxation along a width of the fin structures 215A and 215B, increasing the compressive strain on the channel of the FinFET device 500.

The FinFET device 500 may include additional features, which may be formed by subsequent processing. For example, silicide features may be formed in the source and drain regions of the fin structure fin structures 215A and 215B, specifically on fin portions 285. The silicide features may be formed by a silicidation process, such as a self-aligned silicide (salicide) process. Various contacts/vias/lines and multilayer interconnect features (e.g., metal layers and interlayer dielectrics) may be formed over the substrate 210, configured to connect the various features or structures of the FinFET device 500. The additional features may provide electrical interconnection to the device 500 including the gate structures 250. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 13:
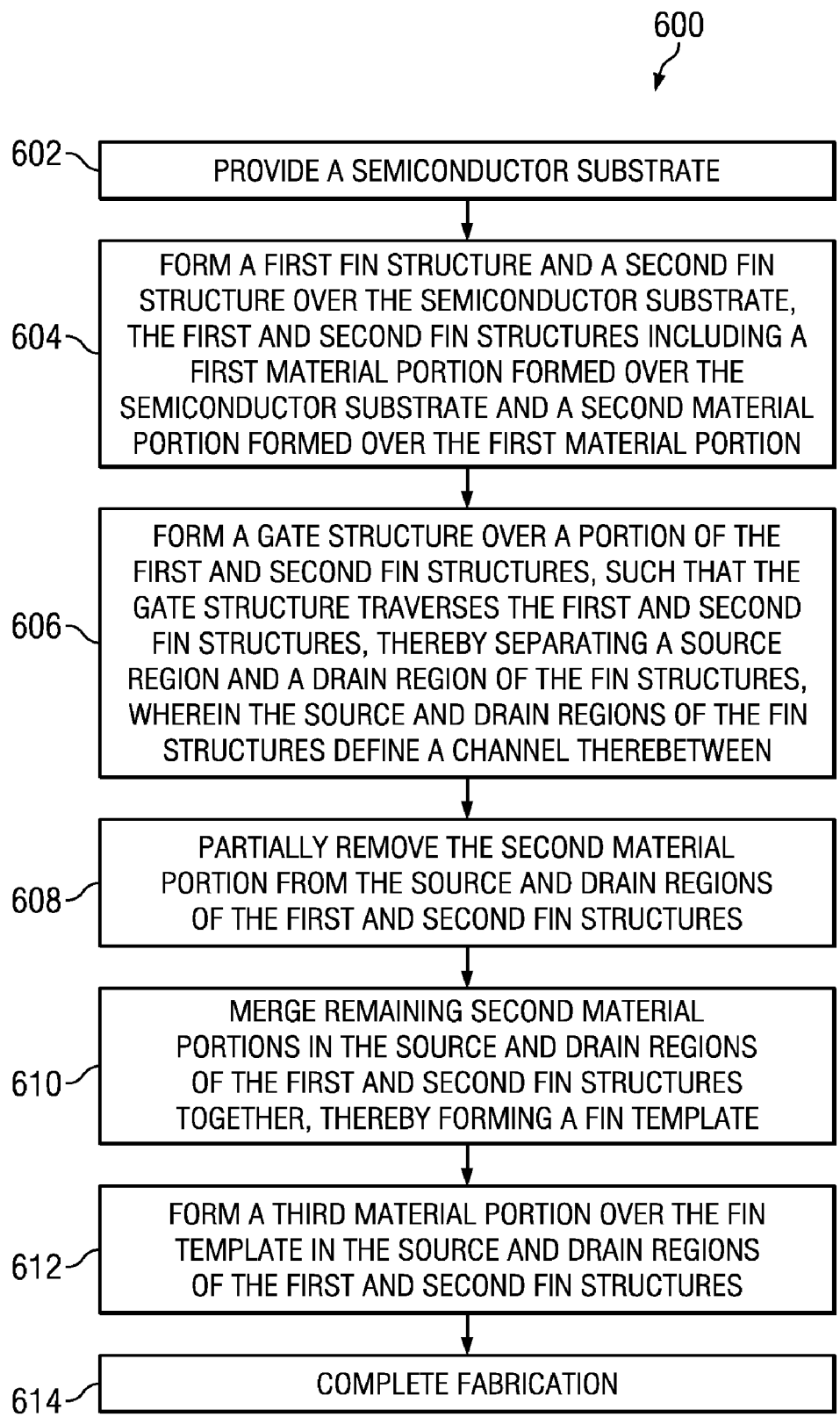
FIG. 13 is a flow chart of yet another method for fabricating a FinFET device according to aspects of the present disclosure.

FIG. 13 is a flow chart of a method 600 for fabricating an integrated circuit device according to various aspects of the present disclosure. In the depicted embodiment, the method 600 fabricates an integrated circuit device that includes a FinFET device. The method 600 begins at block 602 where a semiconductor substrate is provided. At block 604, a first fin structure and a second fin structure is formed over the semiconductor substrate. More specifically, a first material portion of the first and second fin structures is formed over the semiconductor substrate, and a second material portion of the first and second fin structures is formed over the first material portion. At block 606, a gate structure is formed over a portion of the first and second fin structures. The gate structure traverses the first and second fin structures, separating a source region and a drain region of the first and second fin structures. A channel is defined between the source and drain regions of the first and second fin structures. At block 608, the second material portion is partially removed from the source and drain regions of the first and second fin structures. At block 610, remaining second material portions in the source and drain regions of the first and second fin structures are merged together to form a fin template. At block 612, a third material portion is formed over the fin template in the source and drain regions of the first and second fin structures. The method 600 continues with block 614 where fabrication of the integrated circuit device is completed. Additional steps can be provided before, during, and after the method 600, and some of the steps described can be replaced or eliminated for other embodiments of the method.

FIGS. 14A-14C, 15A-15C, 16A-16C, and 17A-17C provide various views of a FinFET device 700, in portion or entirety, at various stages of fabrication according to the method 600 of FIG. 13. The FinFET device 700 may be included in a microprocessor, memory cell, and/or other integrated circuit device. In the depicted embodiment, the FinFET device 700 is an NMOS FinFET device. The FinFET device 700 of FIGS. 14A-14C, 15A-15C, 16A-16C, and 17A-17C is similar in many respects to the FinFET device 500 of FIGS. 5A-5C, 6A-6C, and 7A-7C. Accordingly, similar features in FIGS. 5A-5C, 6A-6C, 7A-7C, 14A-14C, 15A-15C, 16A-16C, and 17A-17C are identified by the same reference numerals for clarity and simplicity. FIGS. 14A-14C, 15A-15C, 16A-16C, and 17A-17C have been simplified for the sake of clarity to better understand the inventive concepts of the present disclosure. Additional features can be added in the FinFET device 700, and some of the features described below can be replaced or eliminated in other embodiments of the FinFET device 700.

Figure 14A:
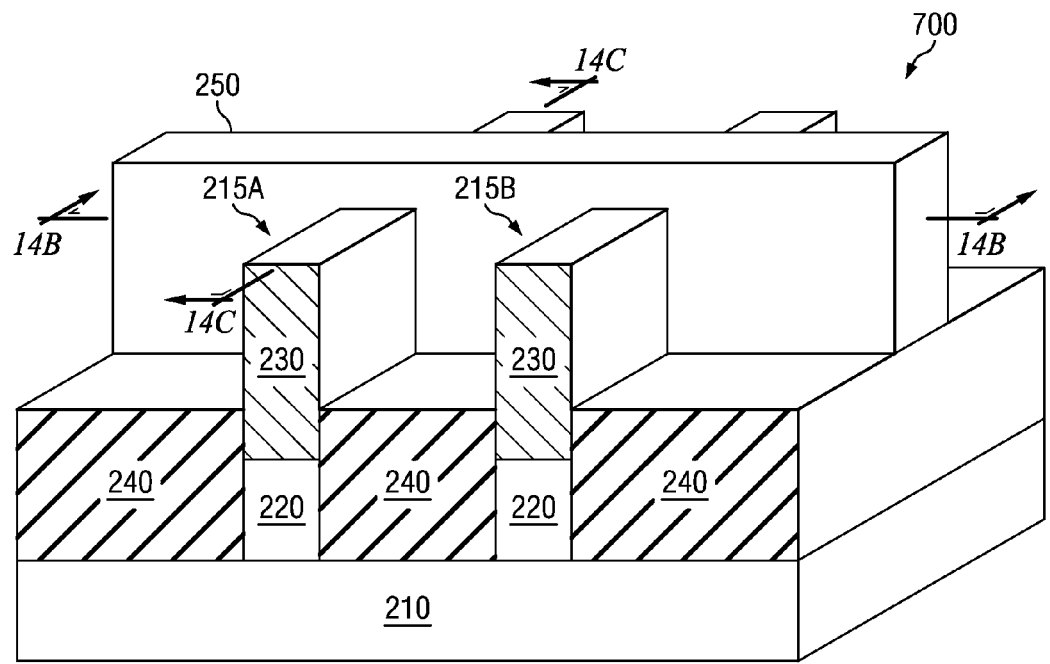
FIGS. 14A, 15A, 16A, and 17A are perspective views of a FinFET device at various fabrication stages according to the method of FIG. 13.
Figure 14B:
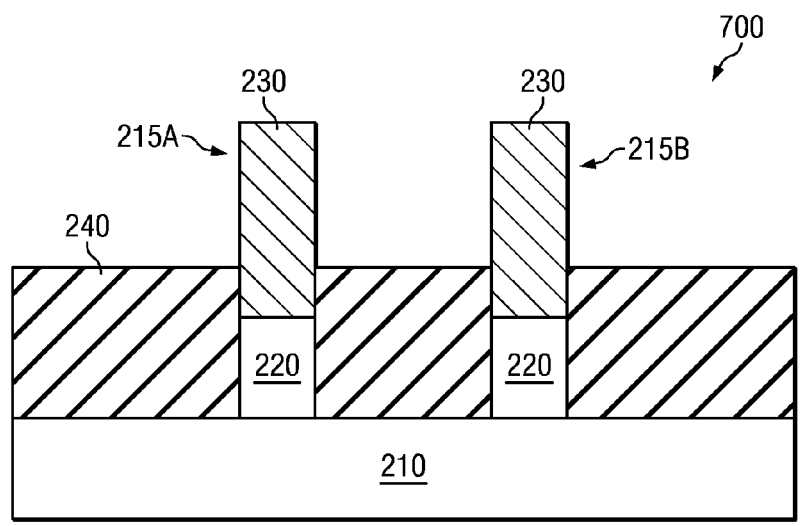
FIGS. 14B, 15B, 16B, and 17B are diagrammatic cross-sectional views of the FinFET device of FIGS. 14A, 15A, 16A, and 17A, respectively.
Figure 14C:
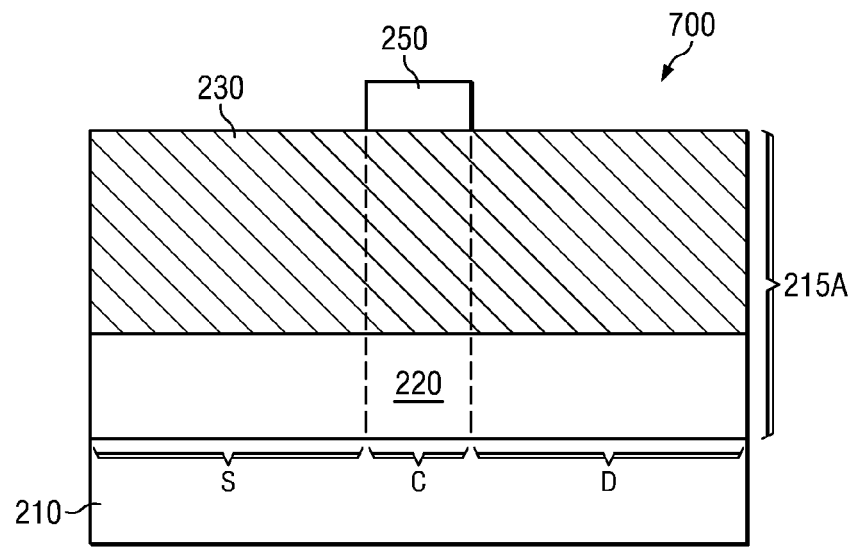
FIGS. 14C, 15C, 16C, and 17C are diagrammatic cross-sectional views along a channel of the FinFET device of FIGS. 14A, 15A, 16A, and 17A, respectively.

FIG. 14A is a perspective view of the FinFET device 700, FIG. 14B is a diagrammatic cross-sectional view of the FinFET device 700 taken along line 14B-14B in FIG. 14A, and FIG. 14C is a diagrammatic cross-sectional view of the FinFET device 700 taken along line 14C-14C in FIG. 14A. The FinFET device 700 includes the substrate 210, fin structures 215A and 215B including fin portions 220 and 230, isolation features 240, and gate structure 250. The fin structures 215A and 215B include a source region and a drain region, and the source and drain regions define a channel region therebetween.

Figure 15A:
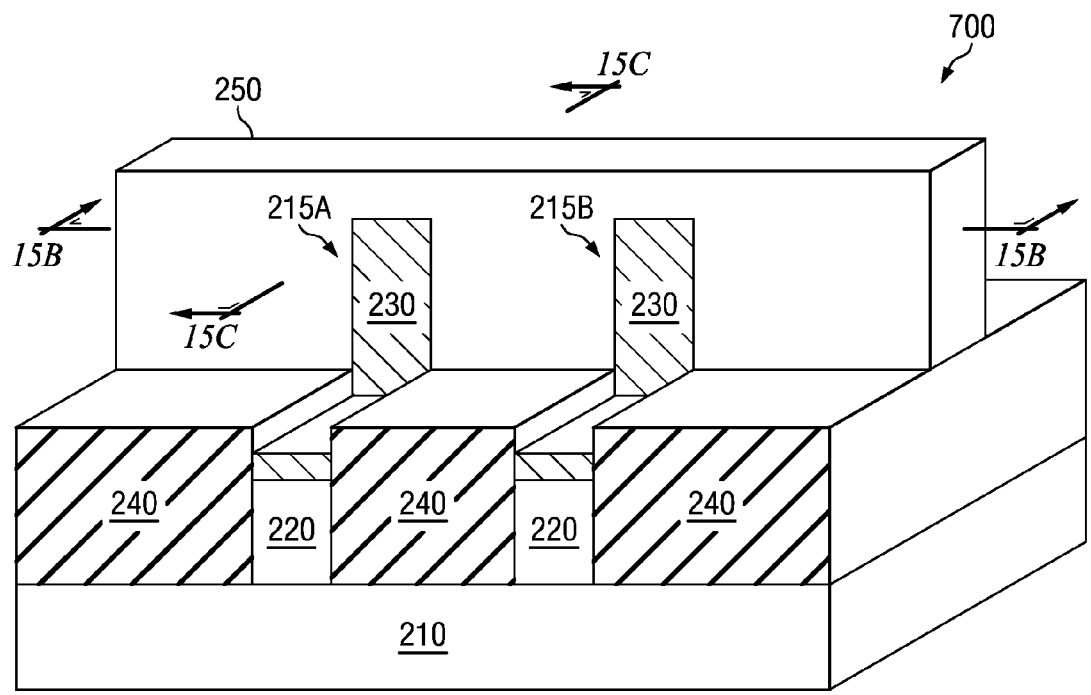
Figure 15B:
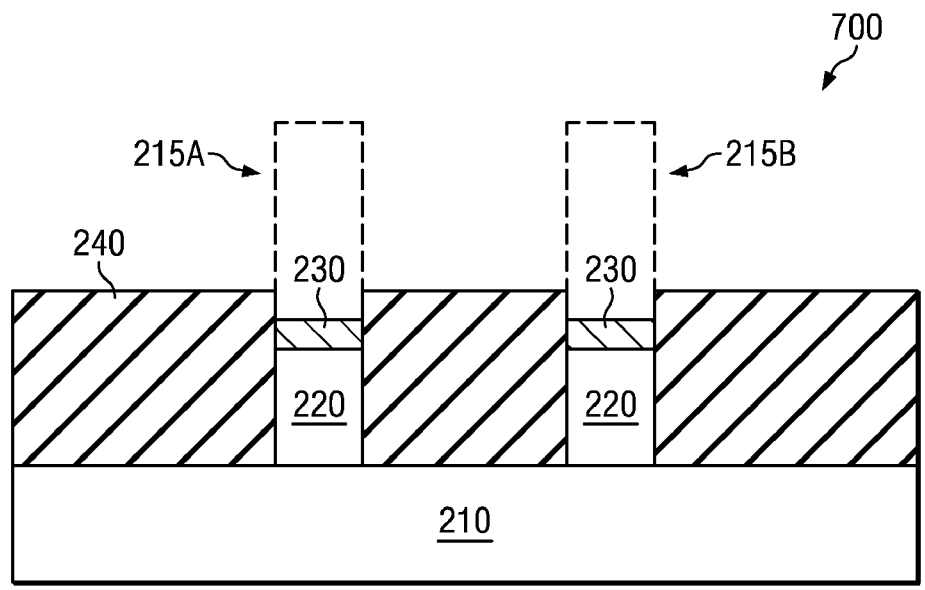
Figure 15C:
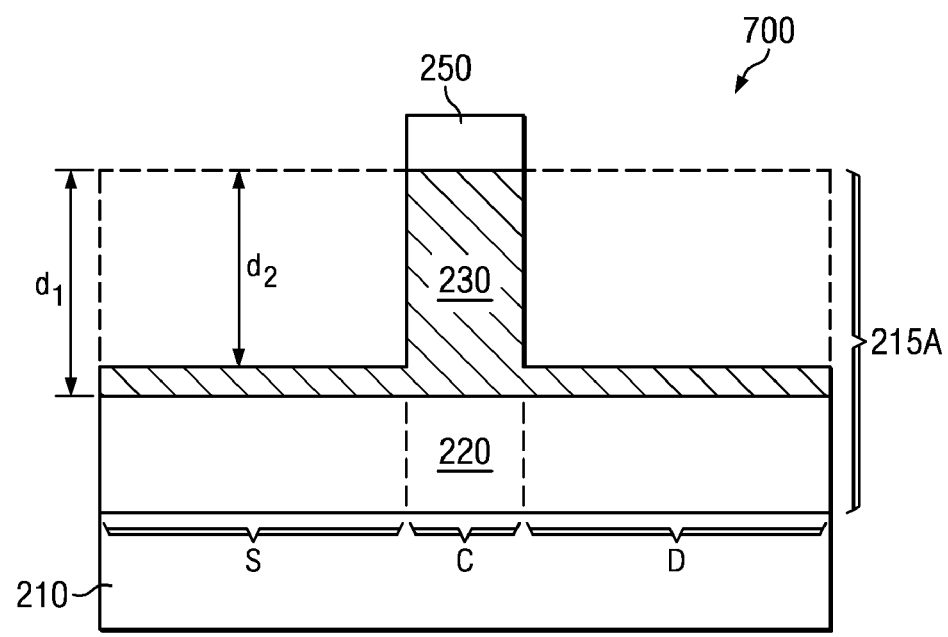

FIG. 15A is a perspective view of the FinFET device 700, FIG. 15B is a diagrammatic cross-sectional view of the FinFET device 700 taken along line 15B-15B in FIG. 15A, and FIG. 15C is a diagrammatic cross-sectional view of the FinFET device 700 taken along line 15C-15C in FIG. 15A. As described above with reference to FIGS. 6A-6C, in FIGS. 15A-15C, the fin portions 230 are partially removed from the source and drain regions of the fins structures 215A and 215B, leaving some of the fin portions 230 remaining in the source and drain regions.

Figure 16A:
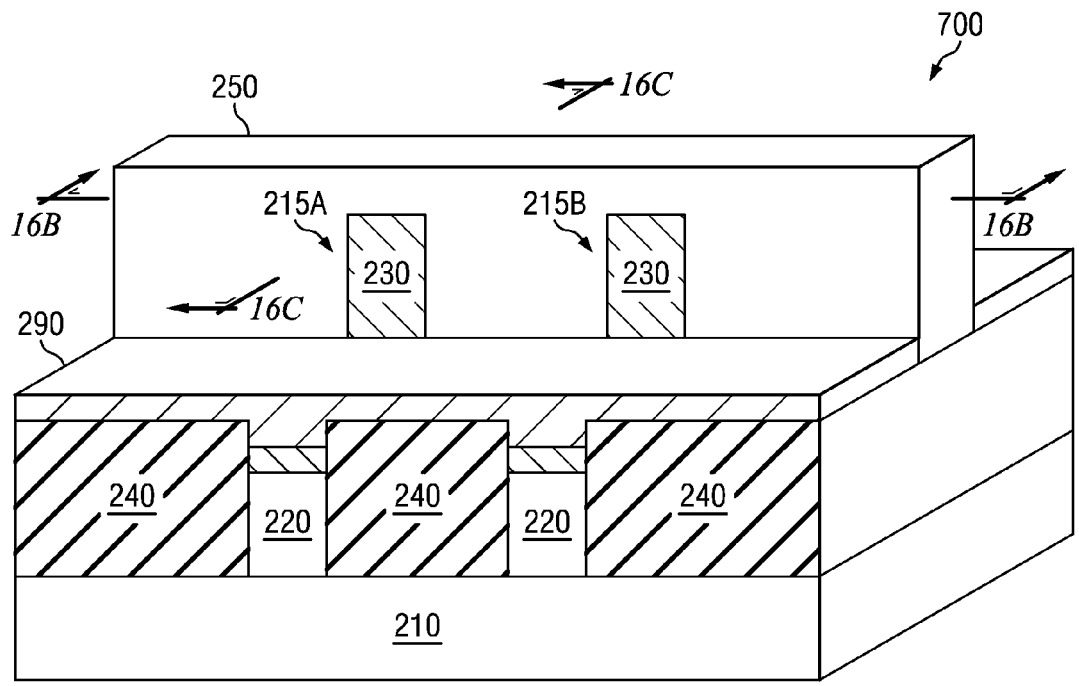
Figure 16B:
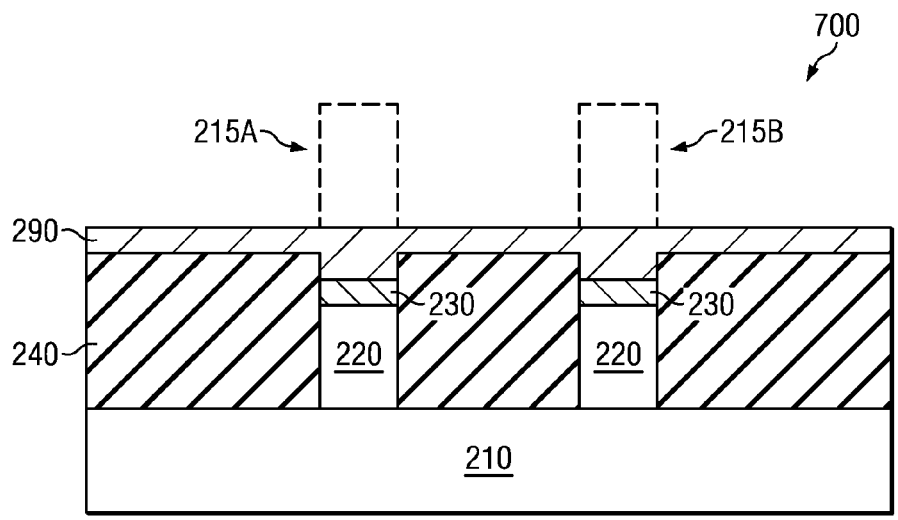
Figure 16C:
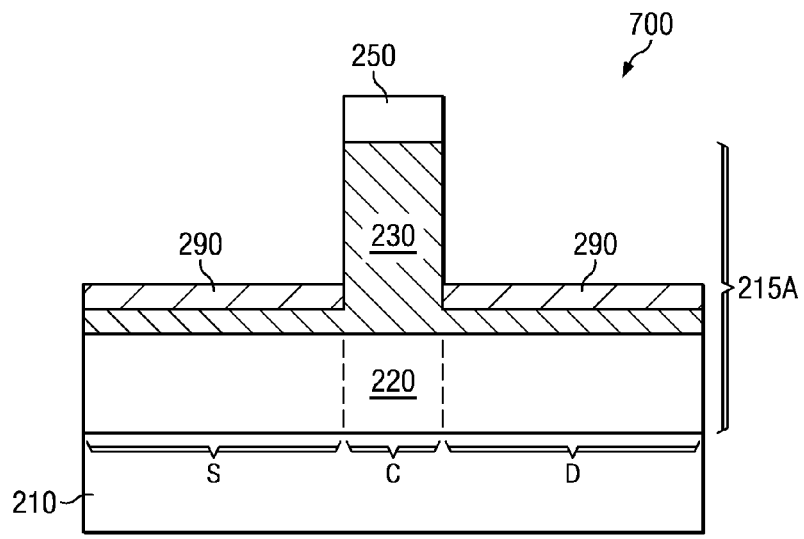

FIG. 16A is a perspective view of the FinFET device 700, FIG. 16B is a diagrammatic cross-sectional view of the FinFET device 700 taken along line 16B-16B in FIG. 16A, and FIG. 16C is a diagrammatic cross-sectional view of the FinFET device 700 taken along line 16C-16C in FIG. 16A. In FIGS. 16A-16C, the fin portions 230 remaining in the source and drain regions of the fin structures 215A and 215B are merged together to form a fin template 290. For example, the fin template 290 may be formed by a process similar to that described above with reference to FIGS. 11A-11C. In the depicted embodiment, a semiconductor material is epitaxially (epi) grown on the fin portions 230 remaining in the source and drain regions. The semiconductor material is epitaxially grown until the fin portions 230 of the fin structures 215A and 215B are merged together to form the fin template 290. Though the fin template 290 and fin portions 230 remaining in the source and drain regions are depicted separately, "fin template" may refer to the newly grown epi semiconductor material alone (depicted as fin template 290) or the newly grown epi semiconductor material combined with the initial fin portions (depicted as fin portions 230 remaining in the source and drain regions). The epitaxy process may use CVD deposition techniques (e.g., VPE and/or UHV-CVD), molecular beam epitaxy, and/or other suitable processes. The epitaxy process may use gaseous and/or liquid precursors. In the depicted embodiment, the fin template 290 includes silicon germanium (SiGe) formed by a silicon germanium epitaxial deposition process. Alternatively, the fin template 290 could include epitaxially grown silicon. The fin template 290 may be doped during deposition (growth) by adding impurities to the source material of the epitaxy process or subsequent to its deposition growth process by an ion implantation process. The doped epitaxial layer may have a gradient doping profile. A CMP process may be performed to planarize the fin template 290. The fin template 290 can minimize stress relaxation along a width of the fin structures 215A and 215B, maximizing strain to the channels of fin structures 215A and 215B and enhancing device performance.

Figure 17A:
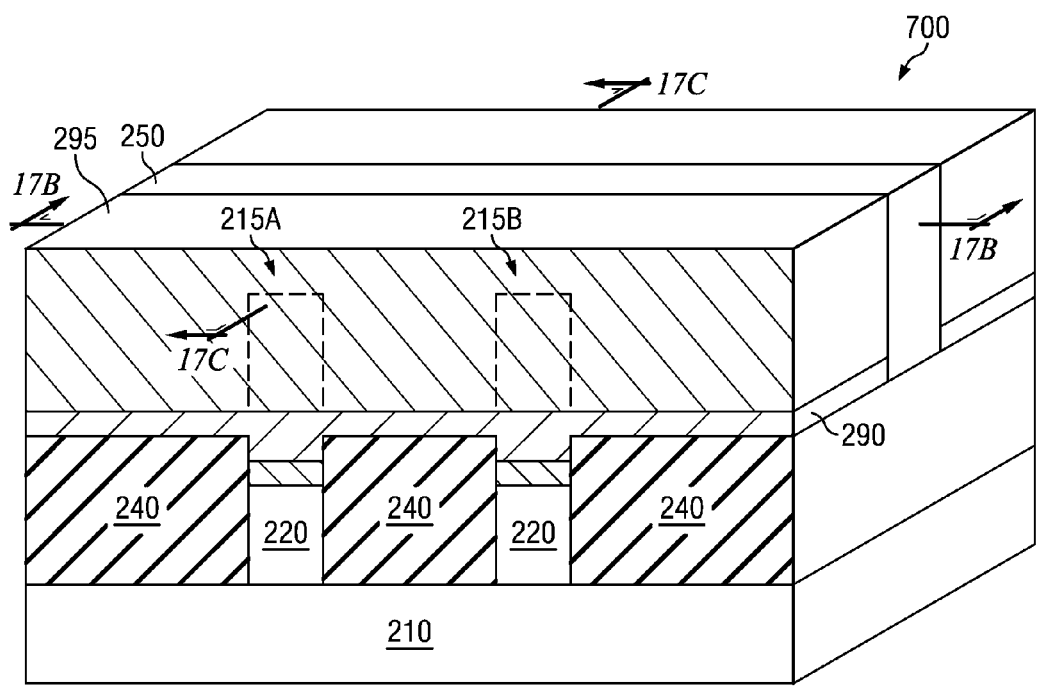
Figure 17B:
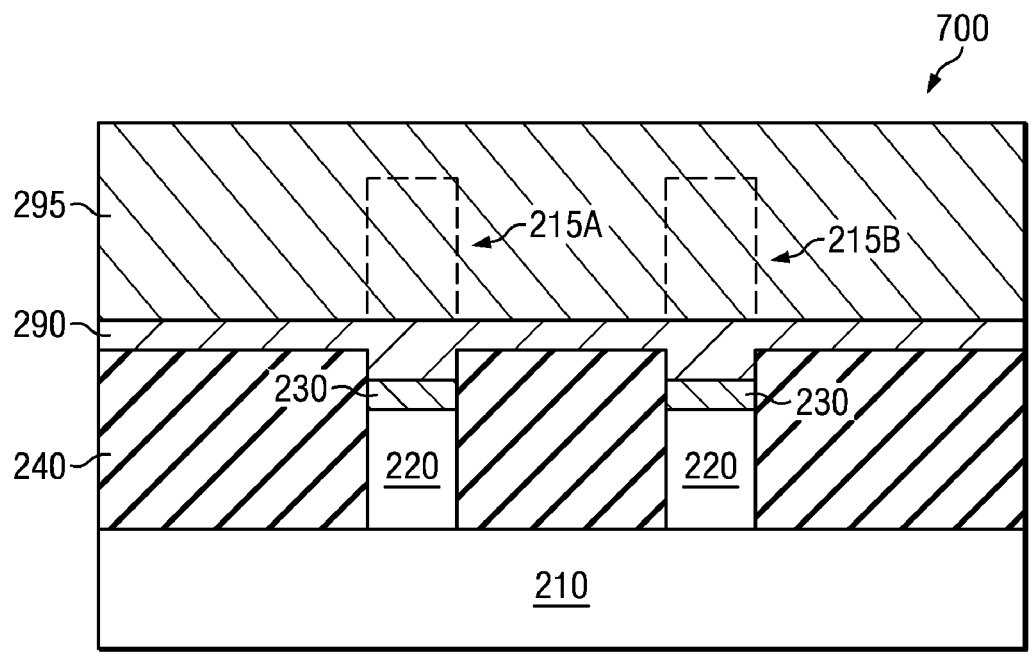
Figure 17C:
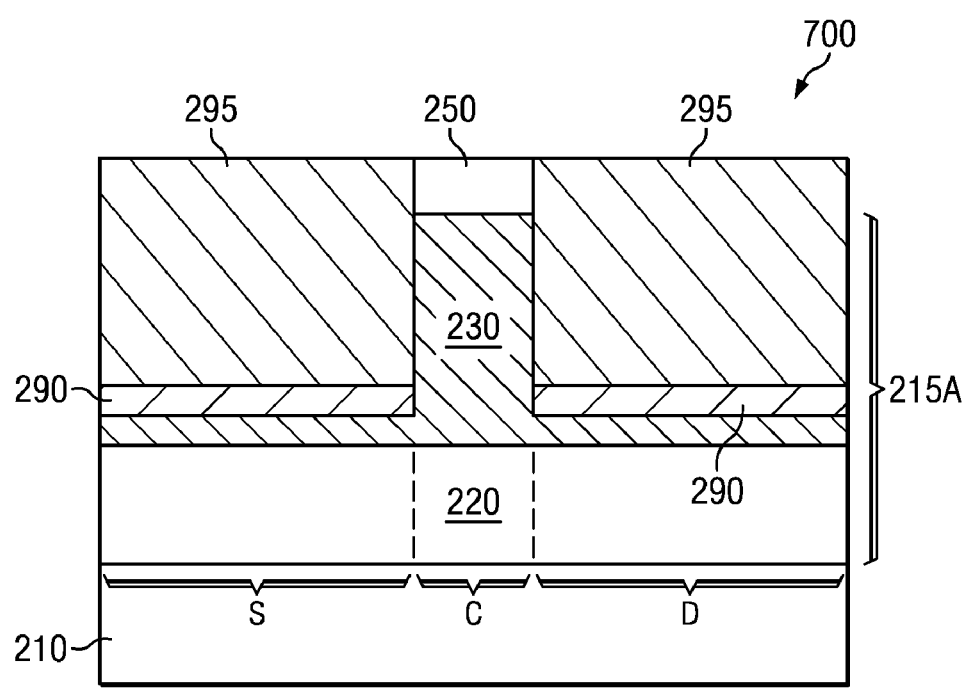

FIG. 17A is a perspective view of the FinFET device 700, FIG. 17B is a diagrammatic cross-sectional view of the FinFET device 700 taken along line 17B-17B in FIG. 17A, and FIG. 17C is a diagrammatic cross-sectional view of the FinFET device 700 taken along line 17C-17C in FIG. 17A. In FIGS. 17A-17C, a fin portion 295 is formed over the fin template 290, providing the fin structures 215A and 215B with the fin portion 295. For example, a semiconductor material is epitaxially (epi) grown on the fin template 290. The epitaxy process may use CVD deposition techniques (e.g., VPE and/or UHV-CVD), molecular beam epitaxy, and/or other suitable processes. The epitaxy process may use gaseous and/or liquid precursors. In the depicted embodiment, the fin portion 295 includes epitaxially grown SiGe. The SiGe concentration of the fin portion 295 may be represented by $Si_{1-z}Ge_z$, where z represents Ge composition in atomic percent. In the depicted embodiment, z is less than or equal to 1, and greater than or equal to 0. Alternatively, the fin portion 295 could include epitaxially grown Si. The fin portion 295 may be doped during deposition (growth) by adding impurities to the source material of the epitaxy process or subsequent to its deposition growth process by an ion implantation process. The doped epitaxial layer may have a gradient doping profile. A CMP process may be performed to planarize the fin portion 295. Further, before or after forming the fin portion 295, implantation, diffusion, and/or annealing processes may be performed to form HDD features in the source and drain regions of the fin structures 215A and 215B.

As illustrated in FIGS. 17A-17C, the fin structures 215A and 215B include fin portions 220, fin portions 230, fin template 290, and fin portions 295. More specifically, the source and drain regions of the fin structures 215A and 215B include fin portions 220, 230, 290, and 295. The channel of the fin structures 215A and 215B includes fin portions 220 and 230. The fin portions 230, 290, and/or 295 in the source and drain regions are alternatively referred to as strained source and drain features of the FinFET device 700. In the depicted embodiment, fin portions 220 include Si, fin portions 230 and 290 include $Si_{1-x}Ge_x$, and fin portions 295 include $Si_{1-z}Ge_z$, where z is less than x. The fin portions 230, 290, and 295 provide tensile stress to the channel of the fins structures 215A and 215B, enhancing electron mobility in the channel of the NMOS FinFET device 700.

The FinFET device 700 may include additional features, which may be formed by subsequent processing. For example, silicide features may be formed in the source and drain regions of the fin structure fin structures 215A and 215B, specifically on fin portions 295. The silicide features may be formed by a silicidation process, such as a self-aligned silicide (salicide) process. Various contacts/vias/lines and multilayer interconnect features (e.g., metal layers and interlayer dielectrics) may be formed over the substrate 210, configured to connect the various features or structures of the FinFET device 700. The additional features may provide electrical interconnection to the device 700 including the gate structures 250. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

It should be noted that the FinFET devices 200, 300, 500, and/or 700 can be fabricated in a single integrated circuit device using the methods 100, 400, and 600 described above. Referring to FinFET devices 200, 300, 500, and 700, by controlling source and drain trench depth (for example, d1 and d2) for the strained/epi source and drain features, strain for both PMOS and NMOS FinFET devices can be achieved and optimized. For example, as described above, fin portions 230 are completely removed from the source and drain regions of the fin structures 215A and 215B in FinFET devices 200 and 500, yet are partially removed from the source and drain regions of the fin structures 215A and 215B in FinFET devices 300 and 700. This provides different starting substrates for forming the fin templates, such that different types of strain can be achieved. Accordingly, the trench depth can be tuned to independently optimize performance of each FinFET device in an integrated circuit device. Further, referring to FinFET devices 500 and 700, to remedy stress relaxation issues inherent in conventional FinFET devices, the disclosed methods 400 and 600 merge fins 120 together to form the fin template 280 for FinFET device 500 and fin template 290 for FinFET device 700. The methods 400 and 600 provide a self-aligned source/drain template growth scheme that can be easily implemented into integrated circuit processing and provide maximum raised source and drain features for enhancing FinFET device performance. In particular, the fin templates 180 and 190 provide a planar-like source and drain area for forming the raised source/drain features in the source and drain regions of the fin structures 215A and 215B. This provides minimal stress relaxation along the fin width direction and achieves planar-like channel strain. The disclosed FinFET devices 500 and 700 can thus provide maximum strain to the channels of the fin structures 215A and 215B with limited (or sometimes no) defects and/or dislocations. It is understood that different embodiments may have different advantages, and that no particular advantage is necessarily required of any embodiment.

The present disclosure provides for many different embodiments. For example, the present disclosure provides methods for fabricating an integrated circuit device. In an embodiment, a method includes providing a semiconductor substrate; forming a fin structure over the semiconductor substrate, the fin structure including a first material portion over the semiconductor substrate and a second material portion over the first material portion; forming a gate structure over a portion of the fin structure, such that the gate structure traverses the fin structure, thereby separating a source region and a drain region of the fin structure, wherein the source and drain regions of the fin structure define a channel therebetween; removing the second material portion from the source and drain regions of the fin structure; and after removing the second material portion, forming a third material portion in the source and drain regions of the fin structure.

Removing the second material portion from the source and drain regions of the fin structure may include completely etching the second material portion from the source and drain regions of the fin structure, thereby exposing the first material portion in the source and drain regions of the fin structure. In this case, forming the third material portion in the source and drain regions of the fin structure may include epitaxially growing a semiconductor material over the exposed first material portion. Removing the second material portion from the source and drain regions of the fin structure includes partially etching the second material portion from the source and drain regions of the fin structure. In this case, forming the third material portion in the source and drain regions of the fin structure may include epitaxially growing a semiconductor material over a remaining second material portion.

In an example, removing the second material portion from the source and drain regions of the fin structure may include etching the second material portion to form trenches in the source and drain regions of the fin structure, and forming the third material portion in the source and drain regions includes epitaxially growing a semiconductor material in the trenches. The method may include tuning the etching and epitaxial growing to achieve strain for an NMOS fin-like field effect transistor (FinFET) device or a PMOS FinFET device. Tuning the etching to achieve strain for the NMOS FinFET device may include controlling the etching to partially remove the second material portion from the source and drain regions of the fin structure. Tuning the etching to achieve strain for the PMOS FinFET device may include controlling the etching to completely remove the second material portion from the source and drain regions of the fin structure.

In another embodiment, a method includes providing a semiconductor substrate; forming a first fin structure and a second fin structure over the semiconductor substrate, the first and second fin structures including a first material portion and a second material portion, wherein the first and second fin structures each include a source region, a drain region, and a channel defined between the source and drain regions; forming a first trench in the source and drain regions of the first fin structure; forming a second trench in the source and drain regions of the second fin structure, the second trench having a depth different than the first trench; forming a third material portion in the first trench of the first fin structure; and forming a fourth material portion in the second trench of the second fin structure.

Forming the first trench in the source and drain regions of the first fin structure may include completely removing the second material portion from source and drain regions of the first fin structure, thereby exposing the first material portion in the source and drain regions of the first fin structure. In this case, forming the third material portion in the first trench may include epitaxially growing a semiconductor material over the exposed first material portion. Forming the second trench in the source and drain regions of the second fin structure may include partially removing the second material portion from the source and drain regions of the second fin structure. In this case, forming the fourth material portion in the second trench may include epitaxially growing a semiconductor material over a remaining second material portion. In an example, forming the third and fourth material portions in the first and second trenches may include simultaneously epitaxially growing a semiconductor material in the first and second trenches.

An integrated circuit device is formed by the methods described herein. In an embodiment, the integrated circuit device includes a semiconductor substrate, a first fin structure disposed over the semiconductor substrate, and a second fin structure disposed over the semiconductor substrate. The first fin structure includes a source region and a drain region that include a first material portion disposed over the semiconductor substrate and a second material portion disposed over the first material portion, and a channel defined between the source and drain regions, the channel including the first material portion disposed over the semiconductor substrate and a third material portion disposed over the first material portion. The second fin structure includes a source region and a drain region that include the first material portion disposed over the semiconductor substrate, the third material portion disposed over the first material portion, and a fourth material portion disposed over the third material portion, and a channel defined between the source and drain regions, the channel including the first material portion disposed over the semiconductor substrate and the third material portion disposed over the first material portion. In an example, the first material portion includes Si, the second material portion includes $Si_{1-x}Ge_x$, the third material portion includes $Si_{1-y}Ge_y$, and the fourth material portion includes $Si_{1-z}Ge_z$. In an example, y is independent of x. In an example, y=z. In an example, z is less than x.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a semiconductor substrate;
   forming a fin structure over the semiconductor substrate, the fin structure at least partially embedded within a dielectric layer and including a first semiconductor material portion over the semiconductor substrate and a second semiconductor material portion over the first semiconductor material portion;
   forming a gate structure over a portion of the fin structure and the dielectric layer, such that the gate structure traverses the fin structure, thereby separating a source region and a drain region of the fin structure, wherein the source and drain regions of the fin structure define a channel therebetween;
   after forming the gate structure, removing the second semiconductor material portion from the source and drain regions of the fin structure, wherein removing the second semiconductor material portion from the source and drain regions of the fin structure includes forming a trench in the source and drain regions of the fin structure, the trench extending below a top surface of the dielectric layer; and
   after removing the second semiconductor material portion, forming a third material portion in the source and drain regions of the fin structure.

2. The method of claim 1 wherein the removing the second semiconductor material portion from the source and drain regions of the fin structure includes completely etching the second semiconductor material portion from the source and drain regions of the fin structure, thereby exposing the first semiconductor material portion in the source and drain regions of the fin structure.

3. The method of claim 2 wherein the forming the third material portion in the source and drain regions of the fin structure includes epitaxially growing a semiconductor material over the exposed first material portion.

4. The method of claim 1 wherein the removing the second semiconductor material portion from the source and drain regions of the fin structure includes partially etching the second semiconductor material portion from the source and drain regions of the fin structure.

5. The method of claim 4 wherein the forming the third material portion in the source and drain regions of the fin structure includes epitaxially growing a semiconductor material over a remaining second material portion.

6. The method of claim 1 wherein:
- the removing the second semiconductor material portion from the source and drain regions of the fin structure includes etching the second semiconductor material portion to form the trench in the source and drain regions of the fin structure; and
- the forming the third material portion in the source and drain regions includes epitaxially growing a semiconductor material in the trench.

7. The method of claim 6 further including tuning the etching and epitaxial growing to achieve strain for an NMOS fin-like field effect transistor (FinFET) device or a PMOS FinFET device.

8. The method of claim 7 wherein the tuning the etching to achieve strain for the NMOS FinFET device includes controlling the etching to partially remove the second semiconductor material portion from the source and drain regions of the fin structure.

9. The method of claim 7 wherein the tuning the etching to achieve strain for the PMOS FinFET device includes controlling the etching to completely remove the second semiconductor material portion from the source and drain regions of the fin structure.

10. A method comprising:
- providing a semiconductor substrate;
- forming a first fin structure and a second fin structure over the semiconductor substrate, the first and second fin structures including a first material portion and a second material portion, wherein the first and second fin structures each include a source region, a drain region, and a channel defined between the source and drain regions;
- forming a first trench in the source and drain regions of the first fin structure;
- forming a second trench in the source and drain regions of the second fin structure, wherein the forming the second trench in the source and drain regions of the second fin structure includes partially removing the second material portion from the source and drain regions of the second fin structure;
- forming a third material portion in the first trench of the first fin structure; and
- forming a fourth material portion in the second trench of the second fin structure, wherein the forming the fourth material portion in the second trench includes epitaxially growing a semiconductor material over a remaining second material portion.

11. The method of claim 10 wherein the forming the first trench in the source and drain regions of the first fin structure includes completely removing the second material portion from source and drain regions of the first fin structure, thereby exposing the first material portion in the source and drain regions of the first fin structure.

12. The method of claim 11 wherein the forming the third material portion in the first trench includes epitaxially growing a semiconductor material over the exposed first material portion.

13. The method of claim 10 wherein the forming the third and fourth material portions in the first and second trenches includes simultaneously epitaxially growing a semiconductor material in the first and second trenches.

14. A method comprising:
- forming a fin over a semiconductor substrate and at least partially embedded within a dielectric layer, the fin including a first semiconductor material portion disposed over the semiconductor substrate and a second semiconductor material portion disposed over the first semiconductor material portion;
- forming a gate structure over the fin, such that the gate structure traverses the fin, thereby separating a source region and a drain region of the fin, wherein the source and drain regions of the fin define a channel region therebetween;
- removing the second semiconductor material portion from the source and drain regions of the fin to form a trench extending below a top surface of the dielectric layer in the source and drain regions of the fin; and
- forming a third semiconductor material portion in the source and drain regions of the fin.

15. The method of claim 14 wherein:
- the removing the second conductive material portion from the source and drain regions of the fin includes partially etching the second semiconductor material portion; and
- the forming the third conductive material portion in the source and drain regions of the fin includes epitaxially growing the third semiconductor material portion over a remaining second material portion.

16. The method of claim 14 wherein:
- the removing the second semiconductor material portion from the source and drain regions of the fin includes completely etching the second semiconductor material portion to expose the first semiconductor material portion; and
- the forming the third semiconductor material portion in the source and drain regions of the fin includes epitaxially growing the third semiconductor material portion over the exposed first semiconductor material portion.

17. The method of claim 14 further including:
- forming another fin over the semiconductor substrate, the another fin including another first semiconductor material portion disposed over the semiconductor substrate and another second semiconductor material portion disposed over the another first semiconductor material portion;
- forming another gate structure over the another fin, such that the another gate structure traverses the another fin, thereby separating a source region and a drain region of the another fin, wherein the source and drain regions of the another fin define a channel region therebetween;
- removing the another second semiconductor material portion from the source and drain regions of the another fin; and
- forming a fourth semiconductor material portion in the source and drain regions of the another fin.

18. The method of claim 17 further including simultaneously removing the second semiconductor material portion and the another second semiconductor material portion respectively from the source and drain regions of the fin and the another fin, wherein the second semiconductor material portion is completely removed from the source and drain regions of the fin and the another semiconductor second material portion is partially removed from the source and drain regions of the another fin.

19. The method of claim 10 wherein the second trench has a depth different than the first trench.

* * * * *